(12) United States Patent
Liao et al.

(10) Patent No.: US 9,543,439 B2
(45) Date of Patent: Jan. 10, 2017

(54) SEMICONDUCTOR DEVICE STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chin-I Liao, Tainan (TW); Shih-Chieh Chang, Taipei (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 14/609,988

(22) Filed: Jan. 30, 2015

(65) Prior Publication Data
US 2016/0225904 A1    Aug. 4, 2016

(51) Int. Cl.
*H01L 29/78*     (2006.01)
*H01L 29/165*    (2006.01)
*H01L 29/36*     (2006.01)
*H01L 29/06*     (2006.01)

(52) U.S. Cl.
CPC ........ *H01L 29/7851* (2013.01); *H01L 29/0649* (2013.01); *H01L 29/165* (2013.01); *H01L 29/36* (2013.01); *H01L 29/7848* (2013.01)

(58) Field of Classification Search
CPC ........... H01L 21/823821; H01L 21/845; H01L 27/0886; H01L 27/10826; H01L 29/4179; H01L 29/66795; H01L 29/0649; H01L 29/165; H01L 29/7848; H01L 29/7851; H01L 29/41791
USPC ........ 257/288, 368, 369; 438/151, 197, 199, 438/300
See application file for complete search history.

(56) References Cited

U.S. PATENT DOCUMENTS

| | | | |
|---|---|---|---|
| 7,259,084 B2* | 8/2007 | Chang | H01L 21/02381 257/E21.12 |
| 2013/0113027 A1* | 5/2013 | Chiang | H01L 21/28518 257/288 |
| 2013/0277752 A1* | 10/2013 | Glass | H01L 21/82382 257/369 |

* cited by examiner

*Primary Examiner* — Jarrett Stark
*Assistant Examiner* — Shahed Ahmed
(74) *Attorney, Agent, or Firm* — WPAT, P.C., Intellectual Property Attorneys; Anthony King

(57) ABSTRACT

Some embodiments of the present disclosure provide a semiconductor device. The semiconductor device includes a semiconductive substrate; a gate structure over a fin structure of the semiconductive substrate; a channel portion of the fin structure under the gate structure; and at least one epitaxy region disposed over the semiconductive substrate and in contact with the channel portion. The epitaxy region includes a substance with a first lattice constant larger than a second lattice constant of the semiconductive substrate; and a concentration profile of the substance in the epitaxy region being decreasing from near a bottom portion to near a top portion. The bottom portion is closer to the channel portion than the top portion.

16 Claims, 23 Drawing Sheets

SEMICONDUCTOR DEVICE STRUCTURE AND MANUFACTURING METHOD THEREOF

BACKGROUND

A fin-like field effect transistor (FinFET) is fabricated with a thin "fin" (or fin structure) extending from a substrate. A channel of the FET is formed in this fin. A gate (or gate structure) is provided over the fin. The gate controls current flowing through the channel in the fin.

To enhance a performance of the FinFET, stress is introduced into the channel by some epitaxial region in a source or drain at either side of the channel. Generally, a tensile stress is induced in the channel region of an n-type FinFET, and a compressive stress is induced in the channel region of a p-type FinFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
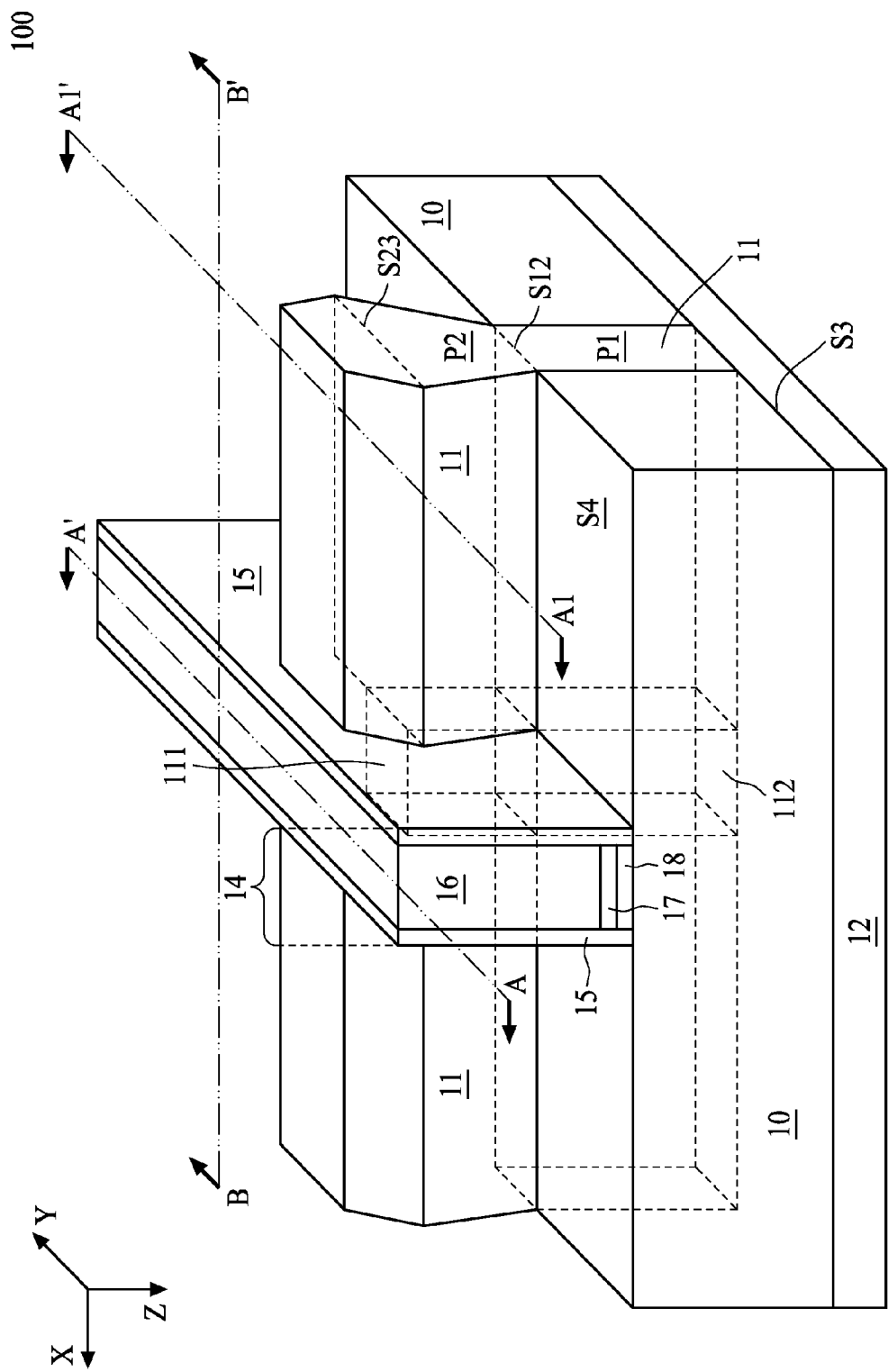
FIGS. 1, 13, 16, and 18 are diagrammatic perspective views of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) therein is provided in accordance with various embodiments. Some variations of the embodiments are discussed. Throughout some various views and illustrative embodiments, like reference numbers are used to designate like elements.

Figure 22:
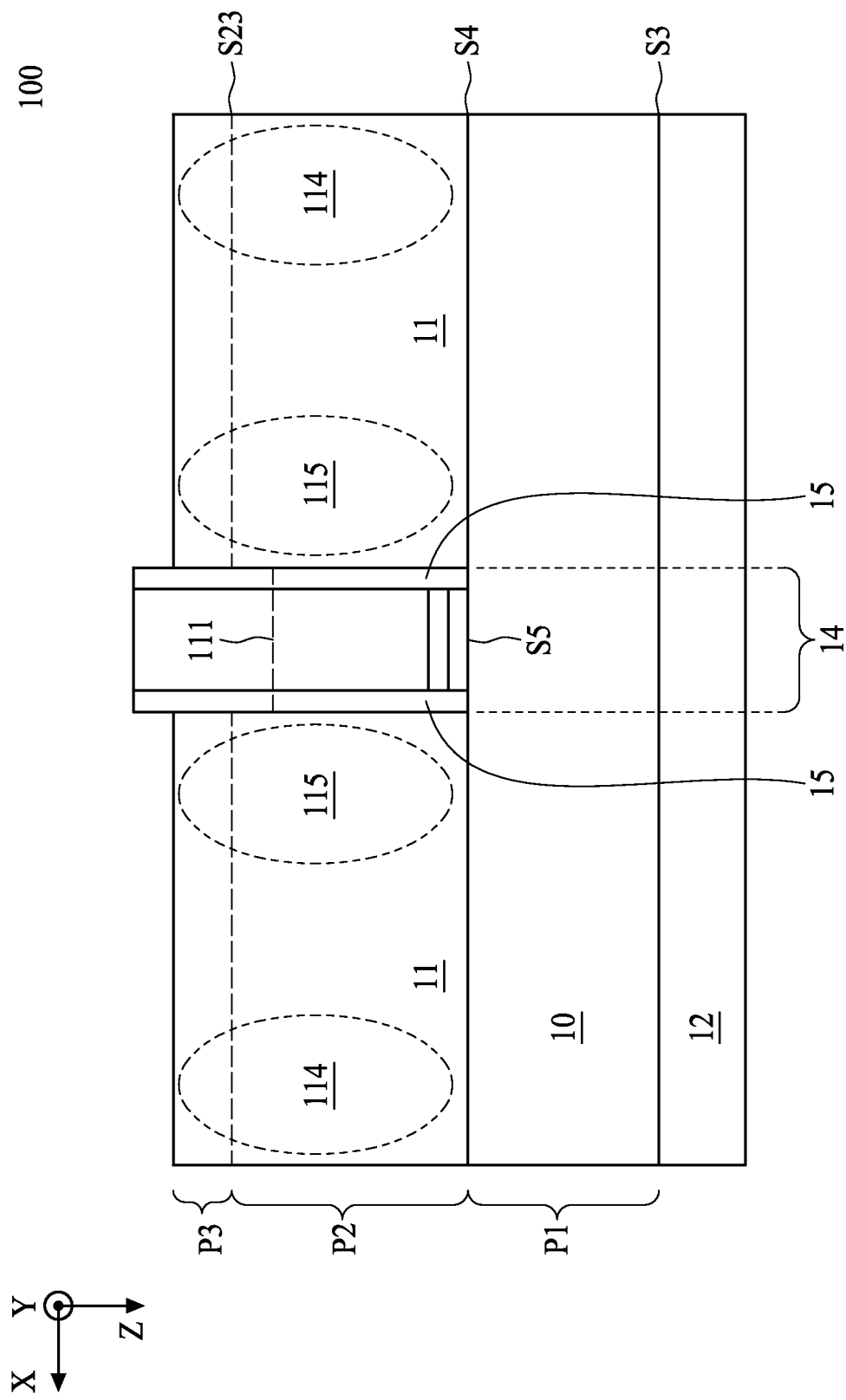
Figure 23:
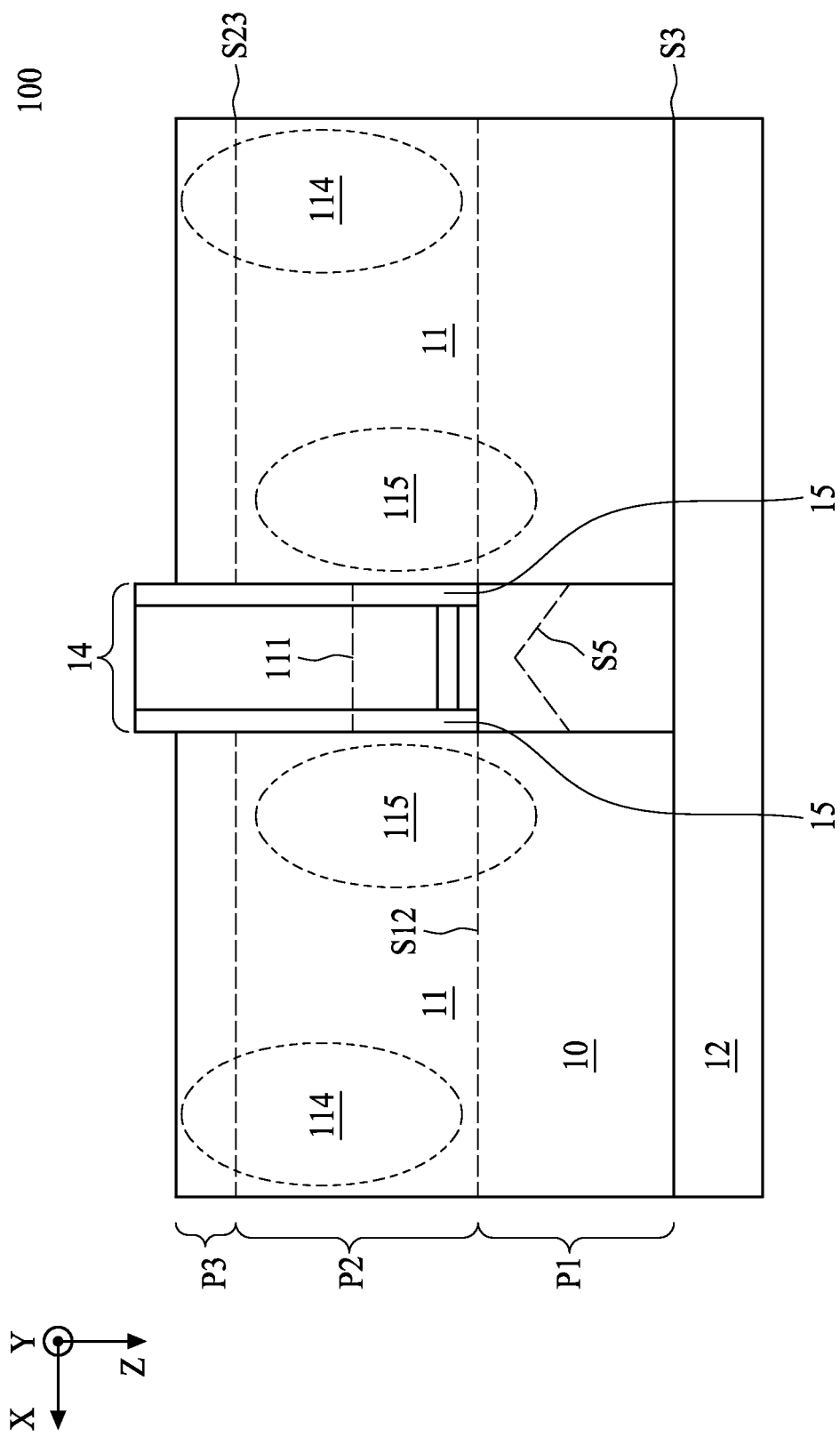

FIGS. 1, 13, 16, and 18 are some diagrammatic perspective views of a FinFET structure according to some embodiments of the present disclosure. FIG. 1 illustrates a diagrammatic perspective view of a semiconductor device 100. The semiconductor device 100 is a FinFET structure. A coordinate system with arrows pointing in three directions X, Y, and Z is illustrated. Direction X, direction Y, and direction Z are orthogonal to each other. Direction X is in a gate-length direction. Unless specified otherwise, throughout the description, the cross-sectional views in FIGS. 3 to 7, 14 to 15, 17, and 19 to 21 are obtained from a view looking in a direction X. Unless specified otherwise, throughout the description, the cross-sectional views in FIGS. 2, 22, and 23 are obtained from a view looking in a direction Y.

Referring to FIGS. 1, 2, 3, and 4, semiconductor device 100 includes a fin structure 112, an isolation region 10, a gate structure 14, a channel portion 111, and some epitaxy regions 11. Gate structure 14 includes a sidewall spacer 15, a gate electrode layer 16, a gate dielectric layer 17, and an interfacial layer 18.

A cross sectional line BB' is drawn over epitaxy region 11 parallel with direction X. A cross sectional line AA' is drawn over gate structure 14 parallel with direction Y. A cross sectional line A1A1' is drawn over epitaxy region 11 parallel with direction Y.

Figure 2:
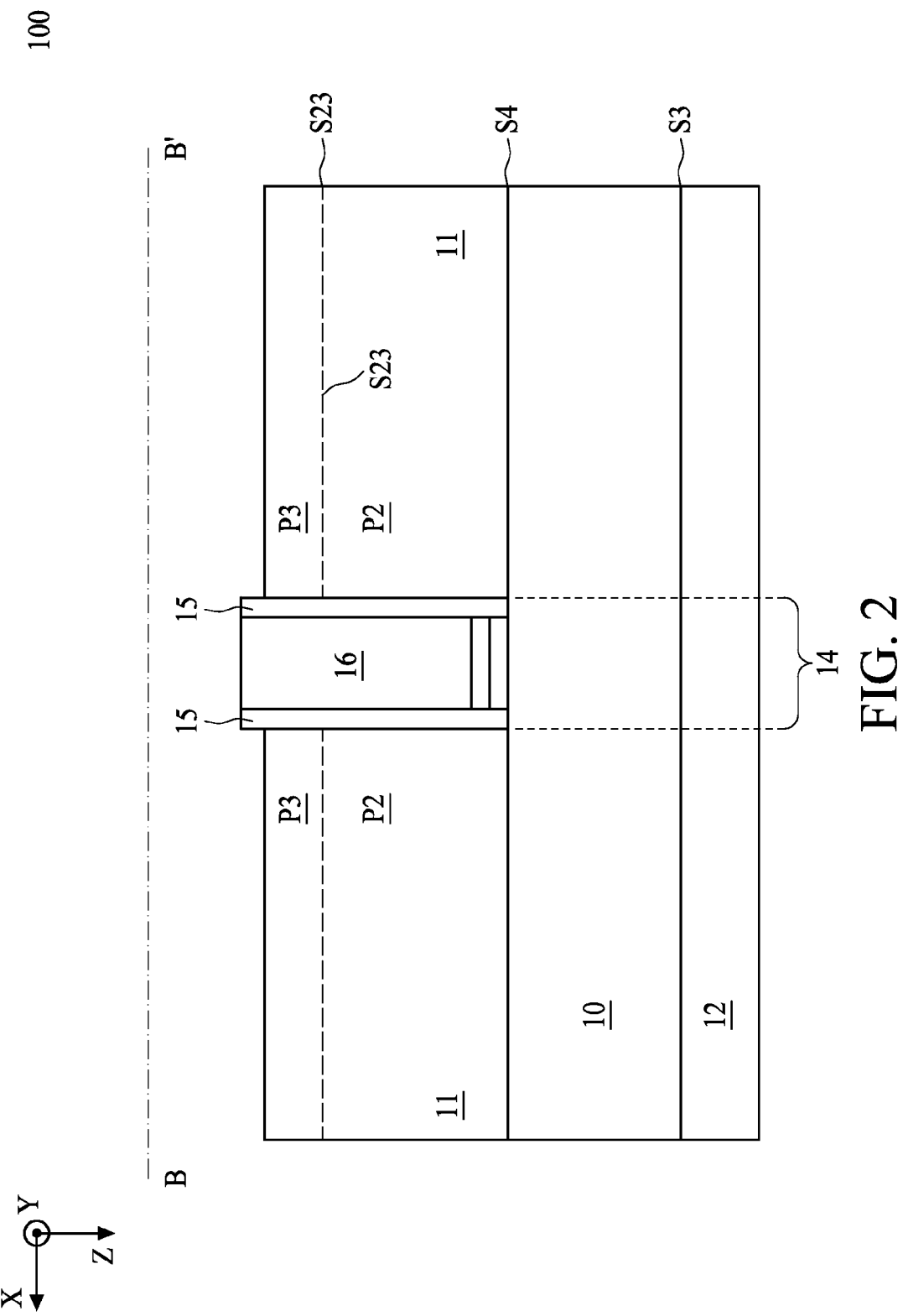
FIGS. 2 to 7, 14 to 15, 17, and 19 to 23 are some cross-sectional views of the semiconductor device, in accordance with some embodiments.
Figure 3:
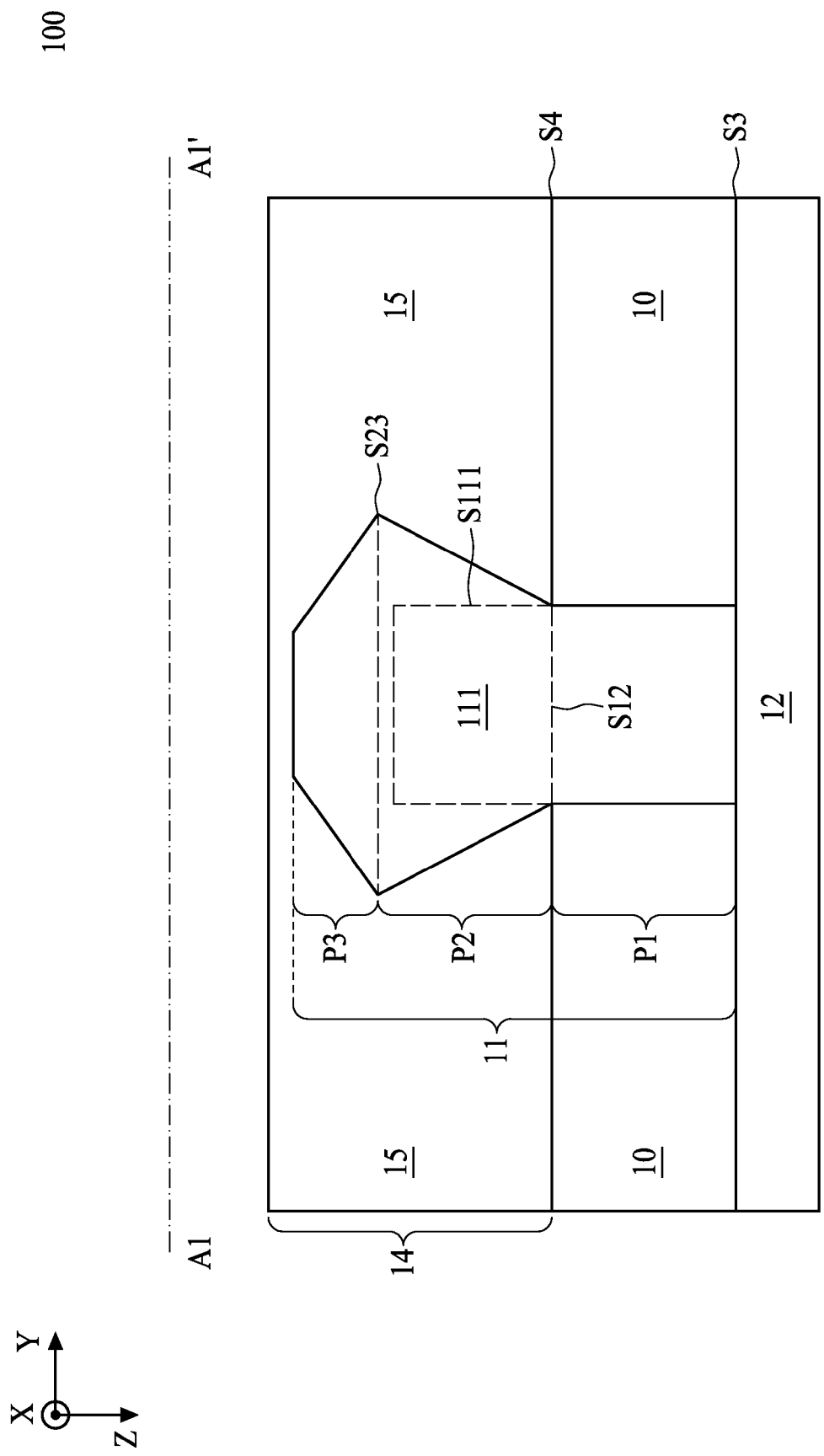
Figure 4:
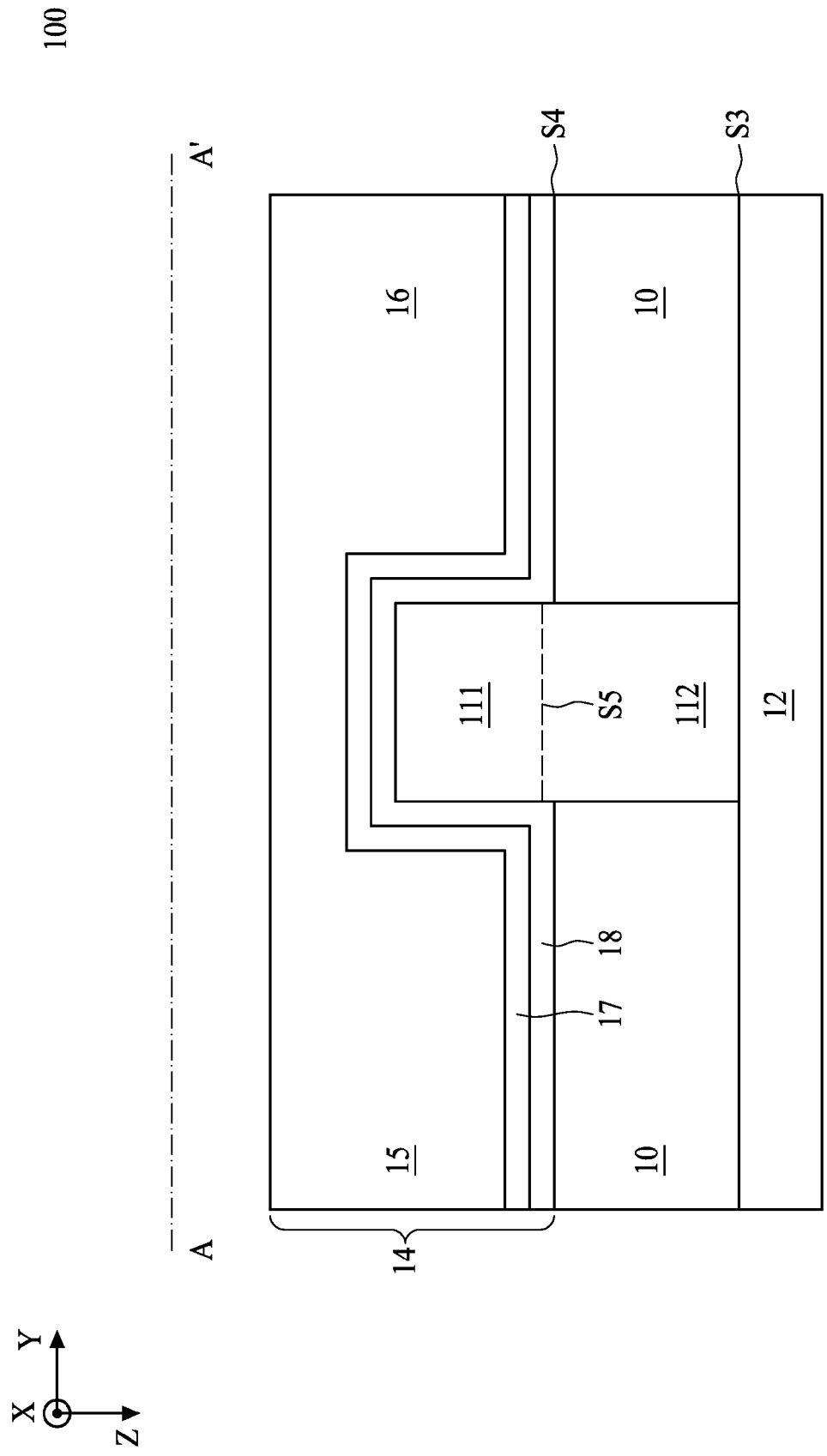

FIG. 2 is a cross sectional view of semiconductor device 100 from cross sectional line BB' in FIG. 1. FIG. 3 is a cross sectional view of semiconductor device 100 from cross sectional line A1A1' in FIG. 1. FIG. 4 is a cross sectional view of semiconductor device 100 from cross sectional line AA' in FIG. 1.

A semiconductive substrate 12 includes an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonite; or combinations thereof. In some embodiments, semiconductive substrate 12 also includes a silicon-on-insulator (SOI) substrate. Some exemplary substrates include an insulator layer. The insulator layer includes any suitable material, including silicon oxide, sapphire, other suitable insulating materials, and/or combinations thereof. An exemplary insulator layer is a buried oxide layer (BOX). In some exemplary FinFET precursors, the insulator layer is a component (e.g., layer) of a silicon-on-insulator substrate. The semiconductive substrate 12 also includes various doped regions as known in an art (e.g., p-type wells or n-type wells). The doped regions are doped with p-type dopants, such as boron or BF2; n-type dopants, such as phosphorus or arsenic; or combinations thereof. The doped regions may be formed directly on the semiconductive substrate 12, in a P-well structure, in an N-well structure, in a dual-well structure, or using a raised structure. The semiconductive substrate 12 further includes various active regions, such as regions configured for an N-type metal oxide-semiconductor transistor device and regions configured for a P-type metal-oxide-semiconductor transistor device. The semiconductive substrate 12 includes various isolation features such as shallow trench isolation (STI) features disposed in the semiconductive substrate 12 to separate various devices. A surface S3 is at a top of semiconductive substrate 12. Surface S3 is between semiconductive substrate 12 and isolation regions 10.

Isolation region 10 is under gate structure 14, and is next to fin structure 112 or epitaxy region 11. Isolation regions 10 are on top of the semiconductive substrate 12. A surface S4 is at a top of isolation region 10.

Exemplary isolation region 10 utilizes an isolation technology, such as shallow trench isolation (STI), to define and electrically isolate various regions such as fin structure 112. The isolation region 10 is composed of silicon oxide, silicon nitride, silicon oxynitride, an air gap, other suitable materials, or combinations thereof.

Fin structure 112 is between isolation regions 10. Fin structure 112 is elongated to include a first longitudinal axis, which is in a same direction as direction X. Fin structure 112 is a protruding portion of an underlying semiconductive substrate 12. Fin structure 112 is continuous on either side of gate structure 14.

A channel portion 111 of fin structure 112 is above isolation region 10. Semiconductive substrate 12 includes channel portion 111 protruding above the fin structure 112. A channel portion 111 of fin structure 112 is covered by gate structure 14 and in contact with sidewall spacer 15. In some embodiments, the channel portion 111 is surrounded by gate structure 14. Channel portion 111 is over the fin structure 112. In some embodiments, the surface S4 is at a same level with a bottom of channel portion 111. A sidewall spacer 15 of gate structure 14 is in contact with channel portion 111 of the fin structure 112. Channel portion 111 of the Fin structure 112 is partially inside a gate structure 14 such that a top surface and some lateral side S111 of channel portion 111 are in contact with gate structure 14. In some embodiments, a boundary S5 is between channel portion 111 and fin structure 112. The boundary S5 is in various curve at variable location. For example, boundary S5 is a concave surface at below surface S4.

Fin structure 112 is made of any suitable material including silicon and silicon germanium. The fin structure 112 includes various doped regions. For example, the doped regions include a lightly doped source/drain (LDD) region (not shown).

A source/drain (S/D) region includes epitaxy region 11. The S/D regions are doped with a p-type dopant, an n-type dopant, and/or combinations thereof. The p-type dopants include boron or BF2; n-type dopants include phosphorus or arsenic. Doping specie is selected based on a type of device, such as an n-type FinFET device or a p-type FinFET device. The S/D regions include various doping profiles.

The epitaxy region 11 is above fin structure 112. Epitaxy regions 11 are discontinuous on either side of gate structure 14. Channel portion 111 is between epitaxy regions 11. Epitaxy region 11 is elongated in a same direction as direction X. Epitaxy region 11 is disposed over the semiconductive substrate 12 and in contact with a lateral side S111 of the channel portion 111. Epitaxy region 11 is in contact with sidewall spacer 15 of gate structure 14. Epitaxy region 11 above the fin structure 112 is partially in contact with the channel portion 111 and the gate structure 14. In some embodiments, epitaxy region 11 is partially exposed above and in between the isolation region 10. Epitaxy regions 11 are nearly symmetrical with respect to the gate structure 14.

The epitaxy region 11 is made of some semiconductor materials with a lattice constant different from that of the fin structure 112 or semiconductive substrate 12. Epitaxy region 11 includes a substance with a first lattice constant different from a second lattice constant of fin structure 112 or semiconductive substrate 12. For example, in some embodiments, epitaxy region 11 includes the substance such as Ge with the first lattice constant larger than the second lattice constant of silicon in fin structure 112 or semiconductive substrate 12. In some other embodiments, epitaxy region 11 includes the substance such as carbon with the first lattice constant smaller than the second lattice constant of silicon in fin structure 112 or semiconductive substrate 12. Epitaxy region 11 includes a substance with a first lattice constant larger than a third lattice constant of channel portion 111. In some embodiments, the second lattice constant is substantially equal to the third lattice constant. In some other embodiments, the second lattice constant is substantially smaller from the third lattice constant. Epitaxy regions 11 provide a tensile strain or a compressive strain to the channel portion 111 of fin structure 112. For the n-type FinFET, or an n-type metal-oxide-semiconductor (NMOS) device, adding SiC in epitaxy region 11 provides a tensile strain. For the p-type FinFET, or a p-type metal-oxide-semiconductor (PMOS) device, adding the substance selected from a group four element in a periodic table such as SiGe in epitaxy region 11 provides a compressive strain. In some embodiments, desired impurities are in epitaxy region 11.

Epitaxy region 11 includes a bulk portion P2 between a bottom portion P1 and a top portion P3. The bulk portion P2 is also a middle portion P2. In some embodiments, the bottom portion P1 is closer to the channel portion 111 than the top portion P3. In some embodiments, the bottom portion P1 is closer to the semiconductive substrate 12 than the top portion P3. The channel portion 111 is in contact with the bulk portion P2 or the bottom portion P1 of the epitaxy region 11.

An interface S23 is between top portion P3 and middle portion P2. An interface S12 is between bottom portion P1 and middle portion P2. In some embodiments, interface S12 is below or above surface S4. In some embodiments, bottom portion P1 is in contact with fin structure 112 and semiconductive substrate 12. Middle portion P2 is partially in contact with channel portion 111.

Gate structure 14 is overlying on top of isolation region 10 and fin structure 112. Gate structure 14 is over the channel portion 111. Gate structure 14 is elongated to include a second longitudinal axis, which is in a same direction as direction Y. Channel portion 111 is illustrated using dashed lines since channel portion 111 is inside gate structure 14. Channel portion 111 of the fin structure 112 is in contact with sidewall spacer 15. A portion of gate structure 14 is in contact with epitaxy region 11 proximate to the channel portion 111 of the fin structure 112. Gate structure 14 is continuous on either side of fin structure 112.

Gate structure 14 includes interfacial layer 18 at a bottom, gate dielectric layer 17 on top of interfacial layer 18, gate electrode layer 16 on top of gate dielectric layer 17, and some sidewall spacer 15 at either side of gate structure 14. A gate stack includes interfacial layer 18, gate dielectric layer 17, and gate electrode layer 16.

An exemplary interfacial layer 18 includes silicon oxide (e.g., thermal oxide or chemical oxide) and/or silicon oxynitride (SiON). The gate dielectric layer 17 is positioned over the interfacial layer 18. The gate dielectric layer 17 includes a dielectric material, such as silicon oxide, silicon nitride, silicon oxynitride, high-k dielectric material, other suitable dielectric material, and/or combinations thereof. Examples of high-k dielectric material includes HfO2, HfSiO, HfSiON, HfTaO, HfTiO, HfZrO, Zirconium oxide, aluminum oxide, hafnium dioxide-alumina (HfOZi-Al$_2$O$_3$) alloy, other suitable high-k dielectric materials, and/or combinations thereof. The gate electrode layer 16 includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

Sidewall spacer 15 is positioned on each side of the gate stack. Sidewall spacer 15 is composed of a nitride material (e.g., silicon nitride), a dielectric material such as silicon nitride, silicon nitride doped with carbon, silicon carbide, silicon oxide, silicon oxynitride, silicon oxynitride doped with carbon, other suitable materials, and/or combinations thereof. In some embodiments, gate structure 14 includes additional layers such as diffusion/barrier layers (not shown), conductive layers (not shown), other suitable layers, and/or combinations thereof.

Figure 5:
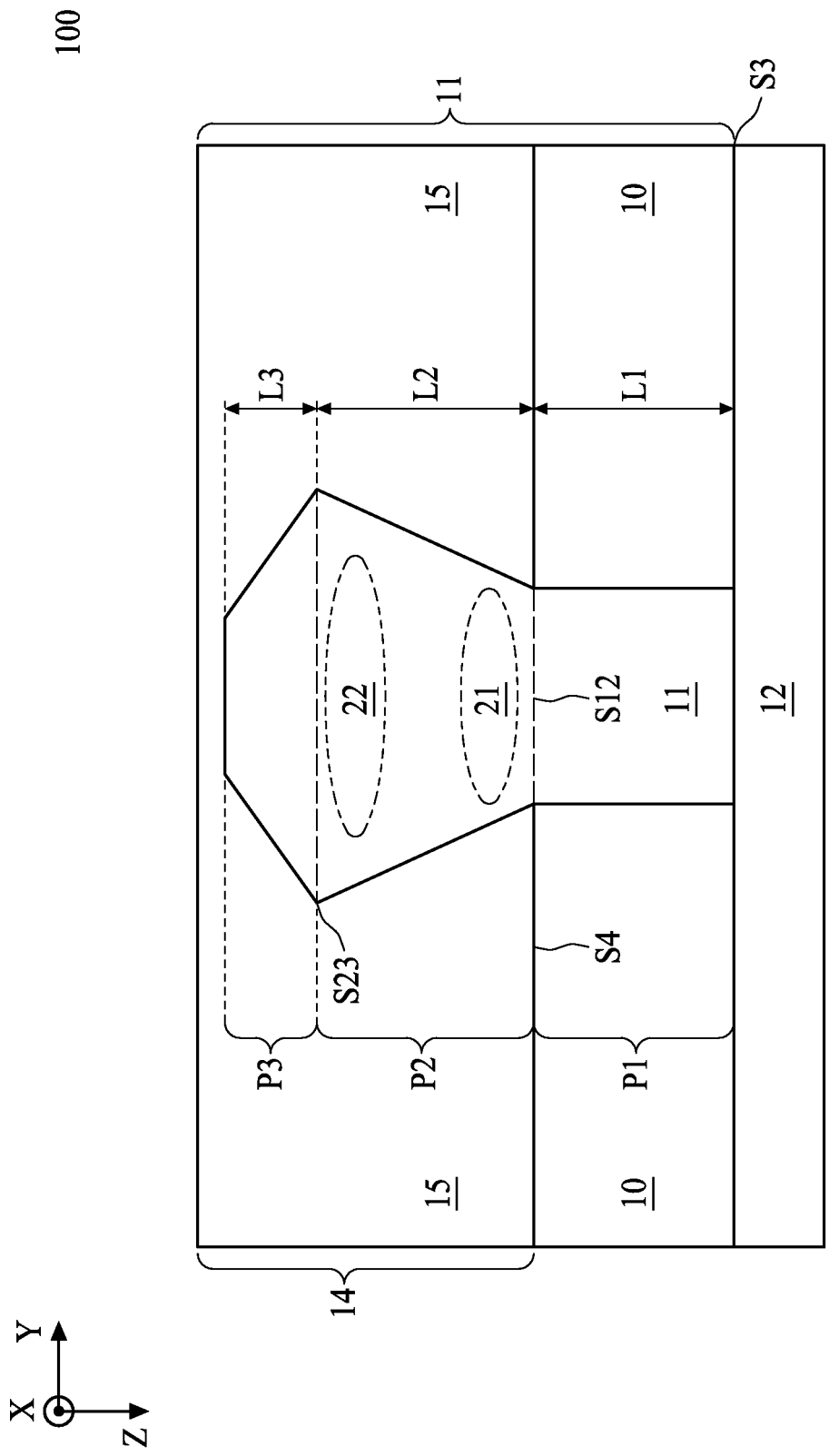

FIG. 5 illustrates the bulk portion P2 includes a portion 21 near the bottom portion P1. The bulk portion P2 includes a portion 22 near the top portion P3. Portion 21 is closer to the semiconductive substrate 12 than portion 22. Top portion P3 includes a length L3 parallel with direction Z. Top portion P3 includes a concentration C3 of the substance such as, SiGe or SiC. Bulk portion P2 includes a length L2 parallel with direction Z. Bulk portion P2 includes a concentration C2 of the substance such as, SiGe or SiC. Bottom portion P1 includes a length L1 parallel with direction Z. Bottom portion P1 includes a concentration C1 of the substance such as, SiGe or SiC. In some embodiments, length L2 is substantially larger than length L3 or length L1.

An interface S23 is between top portion P3 and middle portion P2. Interface S23 is above portion 22. An interface S12 is between bottom portion P1 and middle portion P2. Interface S12 is below portion 22.

Epitaxy region 11 is formed by one or more epitaxy or epitaxial (epi) processes, such that Si features, SiGe features, and/or other suitable features are formed in a crystalline state on semiconductive substrate 12. The epitaxy processes include CVD deposition techniques (e.g., vapor-phase epitaxy (VPE), ultra-high vacuum CVD (UHV-CVD)), molecular beam epitaxy, and/or other suitable processes. The epitaxy process uses gaseous and/or liquid precursors, which interact with a composition of semiconductive substrate 12. In some embodiments, epitaxy region 11 is in-situ doped. Some doping species include p-type dopants, such as boron or BF2; n-type dopants, such as phosphorus or arsenic; and/or other suitable dopants including combinations thereof. In some embodiments, epitaxy region 11 is not in-situ doped. In some embodiments, stress-memory technique SMT is applied to epitaxy region 11 such that a stress effects forms in epitaxy regions 11 and channel portion 111.

Growing epitaxy region 11 is by any suitable method such as some epitaxy processes. A Solid Phase Epitaxy (SPE) process converts an amorphous region of a semiconductor material to crystalline structure to form epitaxy region 11. The SEG process involves growth and etch co-exist. SEG is performed using low pressure chemical vapor deposition (LPCVD) in a chamber. The LPCVD includes exposing surface S3 to a high vacuum. A gaseous flux including the process gas is directed onto surface S3 to deposit the process gas on the surface S3.

Figure 6:
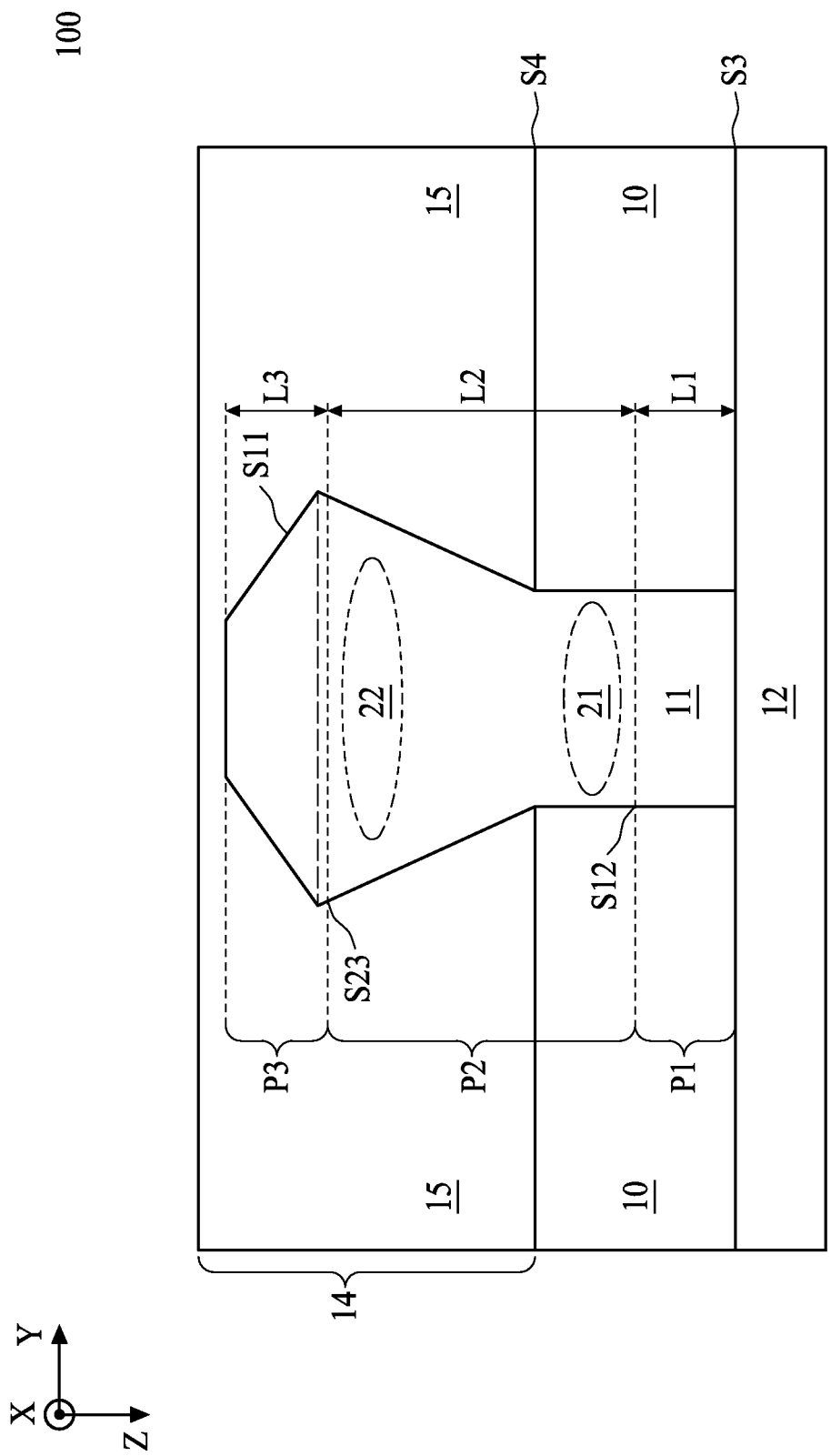

In FIG. 6, in some embodiments, portion 21 of bulk portion P2 is partially or completely below surface S4 such that interface S12 is below surface S4. Top portion P3 includes facet S11 of epitaxy region 11 at a top. Interface S23 is below facet S11. In some embodiment, length L3 is substantially equal to length L1. Length L2 is substantially larger than length L1 or Length L3.

Figure 7:
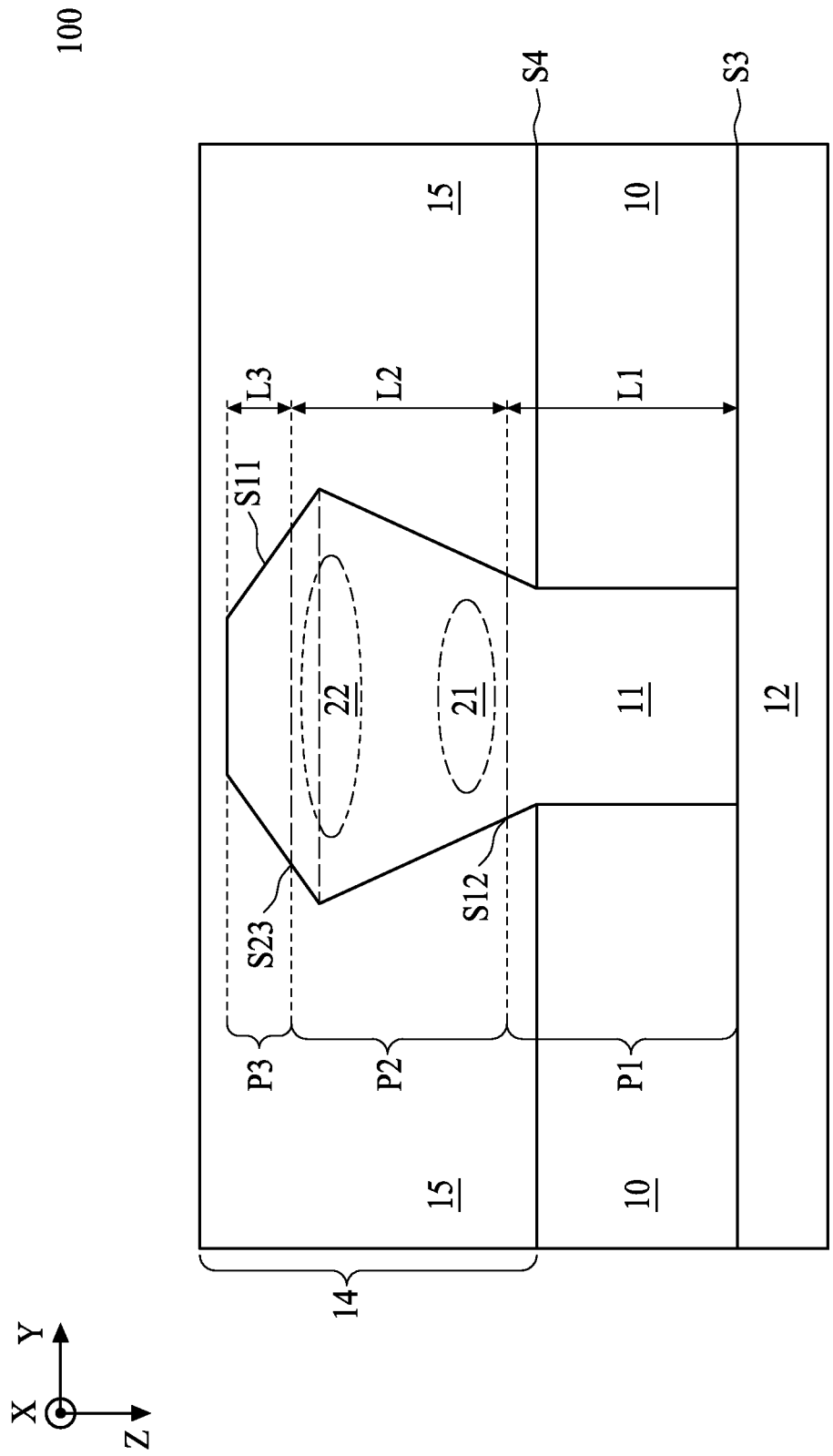

In FIG. 7, in some other embodiments, middle portion P2 includes a portion of facet S11 such that interface S23 meets with facet S11. Portion 22 includes facet S11. In some embodiments, interface S12 is above S4 such that bottom portion P1 is partially above surface S4.

Epitaxy region 11 is partially disposed between isolation regions 10. Some portions of epitaxy region 11 such as bottom portion P1 is below a surface S4 of isolation region 10, and some portions such as top portion P3 and middle portion P2 are above the surface S4. The epitaxy region 11 is a raised source/drain structure to achieve low contact resistance by effectively increases surface areas such as facet S11 of a source/drain region and therefore lowers a sheet resistance. A semiconductor material, such as silicon germanium (SiGe), is epitaxially grown in epitaxy region 11 by a selective epitaxial growth (SEG). The semiconductor material has a lattice constant inside epitaxy region 11 greater than a lattice constant inside semiconductive substrate 12 or channel portion 111. Impurities are doped while an epitaxial growth proceeds. After being annealed, SiGe restores its lattice constant, thus introducing compressive stresses to channel portion 111 of a resulting FinFET device. Since SiGe has a greater lattice constant than silicon, it expands after annealing and applies a compressive stress to channel portion 111.

Figure 8:
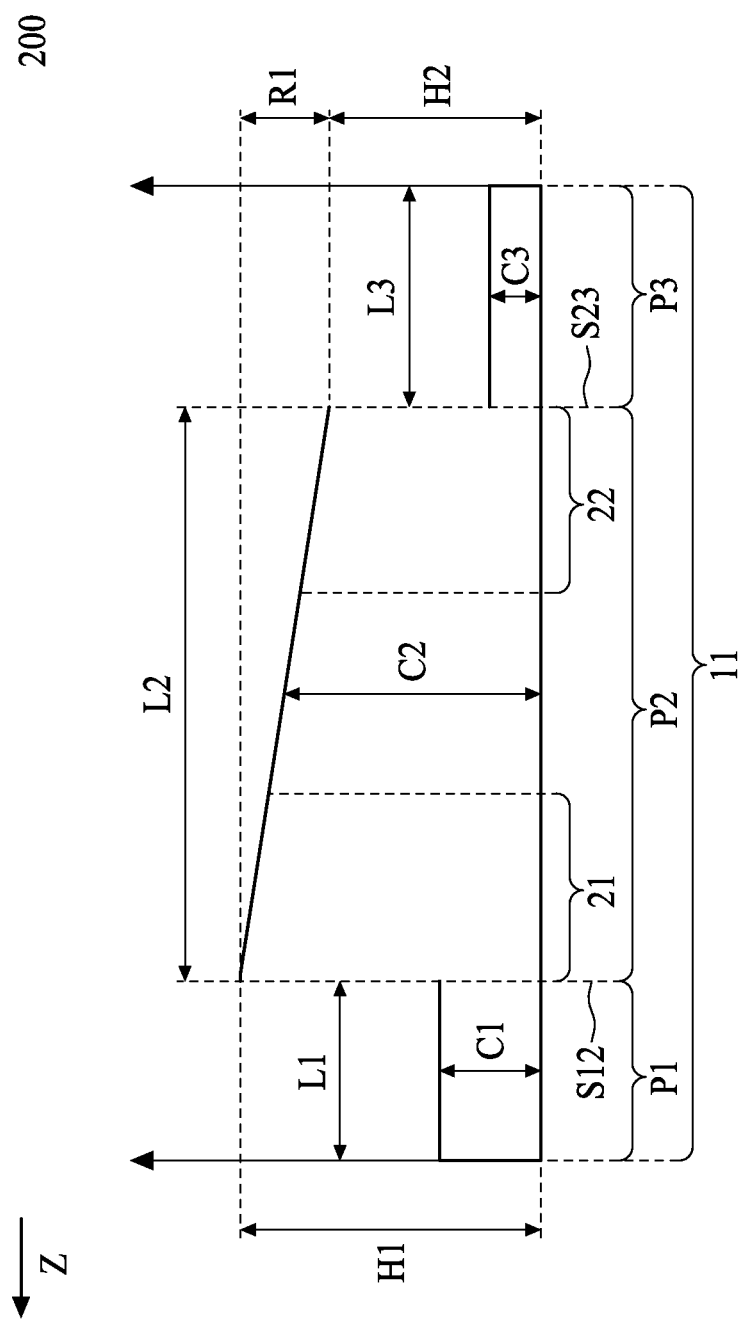
FIGS. 8 to 12 are some concentration profile of the semiconductor device, in accordance with some embodiments.

In FIG. 8, a concentration profile 200 of the substance such as SiGe or SiC in epitaxy region 11 is illustrated. The concentration profile 200 of the substance is illustrated with horizontal axis along direction Z from top portion P3 to bottom portion P1. Vertical axis is a concentration of the substance such as, SiGe or SiC. A concentration C2 of the substance such as, SiGe or SiC is decreasing in the middle portion P2 from portion 21 to portion 22. The concentration C2 of the substance such as, SiGe or SiC is decreasing along with direction Z. In some embodiments, epitaxy region 11 is decreasing over proximately length L2 by a predetermined decrease R1. Middle portion P2 includes concentration C2. Concentration C2 is variable at different location within middle portion P2. Bottom portion P1 includes a concentration C1. In some embodiments, concentration C1 is variable at different location within bottom portion P1. Top portion P3 includes a concentration C3. In some embodiments, concentration C3 is variable at different location within top portion P3. In some embodiments, bottom portion P1 is also referred to as first portion P1. Middle portion P2 is referred to as second portion P2. Top portion P3 is also referred to as third portion P3. The epitaxy region 11 includes a highest concentration H1 of the substance such as, SiGe or SiC near the bottom portion P1. A ratio between predetermined decrease R1 and highest concentration H1 is a decreasing factor of middle portion P2. Middle portion P2 includes highest concentration H1 proximate to interface S12 in portion 21. Middle portion P2 includes a lowest concentration H2 proximate to interface S23 in portion 22. In some embodiments, a difference between highest concentration H1 and lowest concentration H2 in middle portion P2 is the predetermined decrease R1. In some embodiments, the concentration profile 200 of the substance such as, SiGe or SiC in middle portion P2 is decreasing monotonically from near the bottom portion P1 to near the top portion P3. In some embodiments, concentration C1 is higher in the bottom portion P1 than concentration C3 in the top portion P3. Concentration C2 is substantially higher than concentration C3 or concentration C1. Lowest concentration H2 in middle portion P2 is higher than concentration C1 in bottom portion P1 or concentration C3 in top portion P3.

Some average concentrations in top portion P3, middle portion P2, and bottom portion P1 are derived by averaging concentration C3, C2, and C1 over length L3, L2, and L1 respectively. In some embodiments, the average concentration in top portion P3 is substantially equal to or smaller than the average concentration in bottom portion P1. Lowest concentration H2 in middle portion P2 is higher than the average dopant concentration in top portion P3, or bottom portion P1. The average concentration in middle portion P2 is substantially higher than the average dopant concentration in top portion P3, or bottom portion P1.

Concentration C2 in middle portion P2 decreases to concentration C3 in top portion P3 by a first amount. The first amount is larger than the predetermined decrease R1. The first amount is proximately derived by a difference between lowest concentration H2 in middle portion P2 and the average concentration of top portion P3. Concentration C2 in middle portion P2 decreases to concentration C1 in bottom portion P1 by a second amount. The second amount is larger than the predetermined decrease R1. The second amount is proximately derived by a difference between highest concentration H1 in middle portion P2 and the average concentration of bottom portion P1.

A controlling of a growth condition is properly designed to form the concentration C2 of epitaxy region 11 monotonically decreasing in middle portion P2. The concentration C2 of middle portion P2 is adjusted by adjusting a concentration of the substance such as, SiGe or SiC in a precursor flow. Other adjustable parameters of the growth condition include temperature and pressure during the epitaxial growth. For example, the concentration of the substance such as, SiGe or SiC in the precursor flow is greater during the epitaxial growth for portion 21 than for portion 22.

Figure 9:
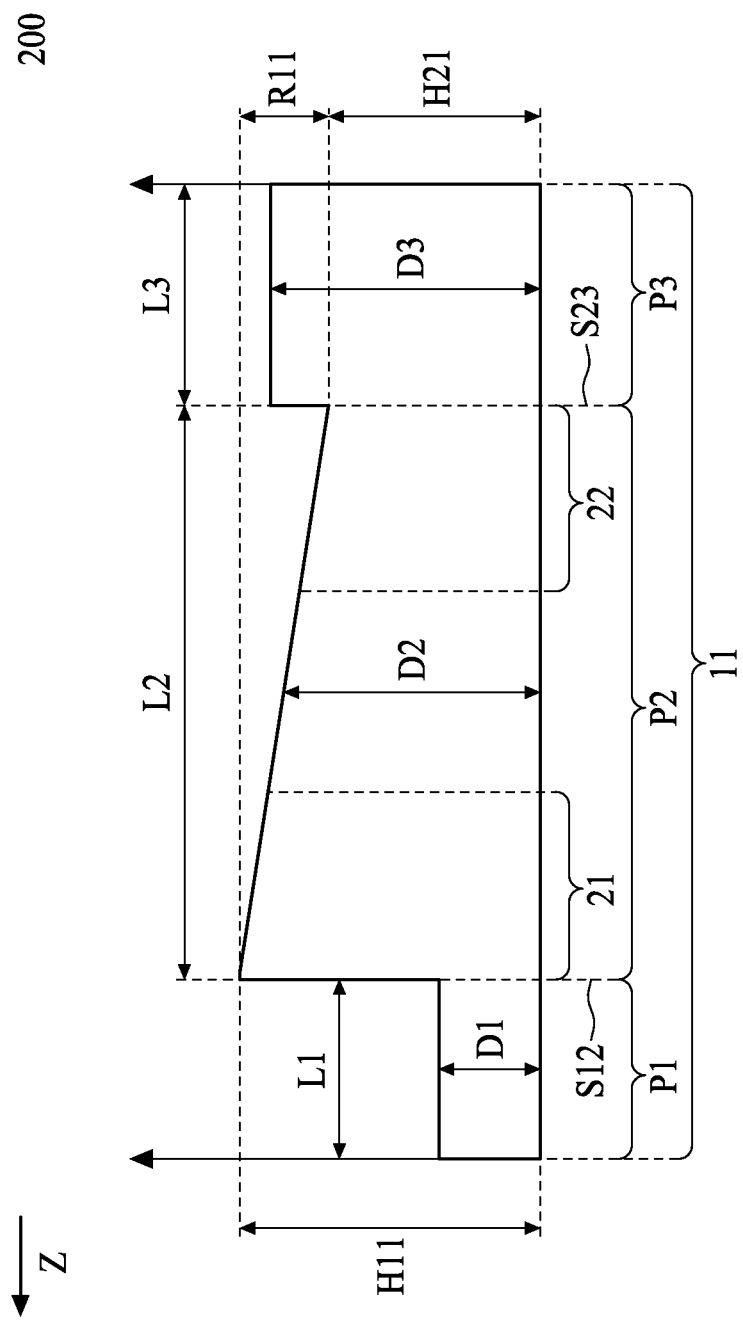

In FIG. 9, a dopant concentration profile 300 of a dopant such as Boron or Phosphorus in epitaxy region 11 is decreasing in the middle portion P2 from portion 21 to portion 22. The dopant concentration profile 300 of the dopant such as Boron or Phosphorus is illustrated with horizontal axis along direction Z from top portion P3 to bottom portion P1. Vertical axis is concentration of the dopant such as Boron or Phosphorus. In some embodiments, epitaxy region 11 is proximately decreasing over length L2 by a predetermined decrease R11. Middle portion P2 includes a dopant concentration D2. Dopant concentration D2 is variable at different location within middle portion P2. Bottom portion P1 includes a dopant concentration D1.

In some embodiments, dopant concentration C1 is variable at different location within bottom portion P1. Third portion P3 includes a dopant concentration D3. In some embodiments, dopant concentration C3 is variable at different location within third portion P3. The epitaxy region 11 includes a highest dopant concentration H11 of the dopant such as Boron or Phosphorus near the bottom portion P1. Middle portion P2 includes highest dopant concentration H11 proximate to interface S12 in portion 21. Middle portion P2 includes a lowest dopant concentration H21 proximate to interface S23 in portion 22. In some embodiments, a difference between highest dopant concentration H11 and lowest dopant concentration H21 in middle portion P2 is the predetermined decrease R11. In some embodiments, the dopant concentration profile 300 of the dopant such as Boron or Phosphorus in middle portion P2 is decreasing monotonically from near the bottom portion P1 to near the top portion P3. In some embodiments, dopant concentration D3 is higher in the top portion P3 than dopant concentration D1 in the bottom portion P1.

Some average dopant concentrations in top portion P3, middle portion P2, and bottom portion P1 are derived by averaging dopant concentration D3, D2, and D1 over length L3, L2, and L1 respectively. The average dopant concentration in middle portion P2 is substantially equal to or lesser than the average dopant concentration in top portion P3. Lowest dopant concentration H21 in middle portion P2 is lower than the average dopant concentration in top portion P3. Lowest dopant concentration H21 in middle portion P2 is higher than the average dopant concentration in bottom portion P1.

In FIG. 9, in some embodiments, dopant concentration profile 300 is different from concentration profile 200 of the substance such as SiGe or SiC in FIG. 8. In dopant concentration profile 300, dopant concentration D3 in top portion P3 is substantially higher than dopant concentration D1 in lower portion P1. Dopant concentration D3 in top portion P3 is proximately equal to highest dopant concentration H11.

In concentration profile 200 in FIG. 8, concentration C3 of the substance such as, SiGe or SiC in top portion P3 is lower than concentration C1 of the substance such as, SiGe or SiC in bottom portion P1. Concentration C3 of the substance such as, SiGe or SiC is substantially lower than highest concentration H1 of the substance such as, SiGe or SiC in FIG. 8.

Figure 10:
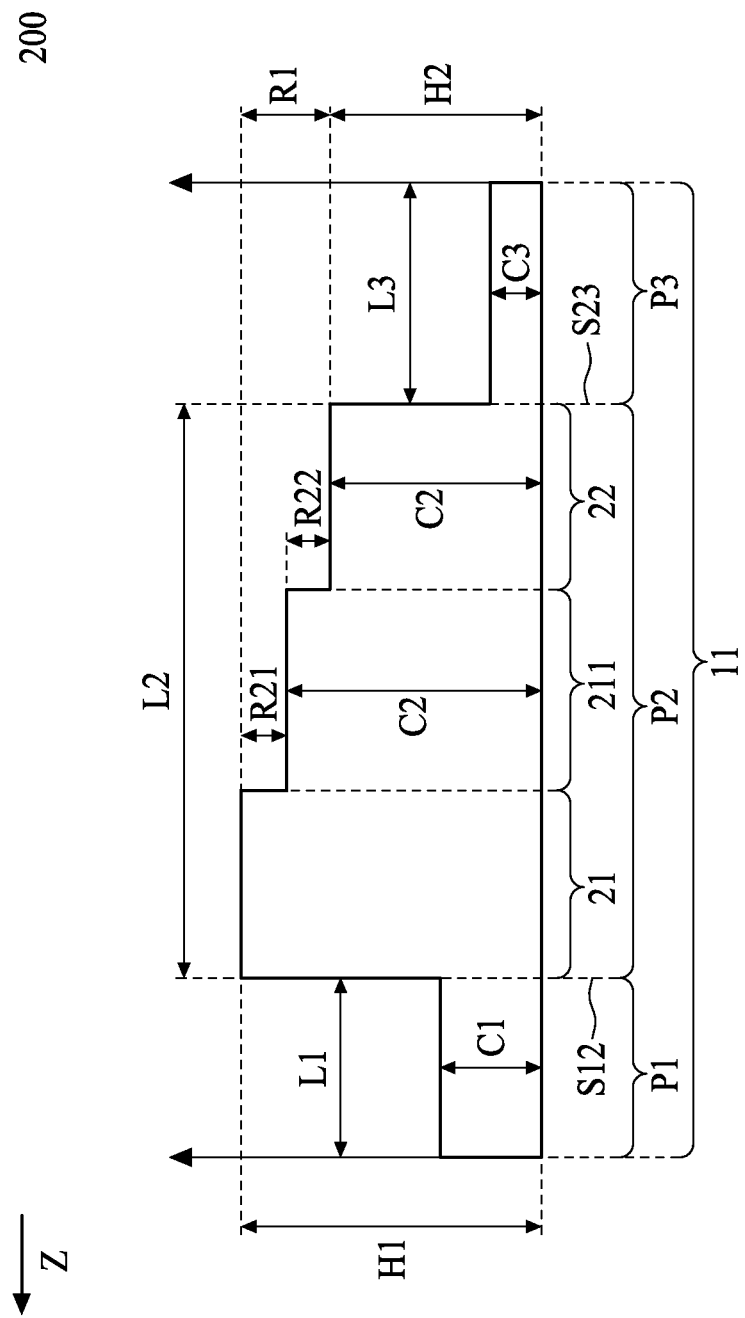

In FIG. 10, in some embodiments, the concentration profile 200 of the substance such as, SiGe or SiC in middle portion P2 is decreasing discontinuously from near the bottom portion P1 to near the top portion P3. For example, the concentrations C2 in portion 21 are substantially constant. The concentrations C2 in portion 22 are also substantially constant. A difference in concentrations C2 between portion 21 and portion 22 is proximately the predetermined decrease R1. Concentration C2 in portion 21 is substantially equal to highest concentration H1. Portion 221 is between portion 21 and portion 22. Concentration C2 in portion 21 is higher than concentration C2 in portion 211 by a predetermined decrease R21. Concentration C2 in portion 211 is higher than concentration C2 in portion 22 by a predetermined decrease R22. In some embodiments, concentration profile 200 of epitaxy region 11 includes multiple numbers of layers. For example, middle portion P2 includes 5 layers (not shown) each includes distinct concentration C2. Concentration C2 in each layer is substantially uniform.

Figure 11:
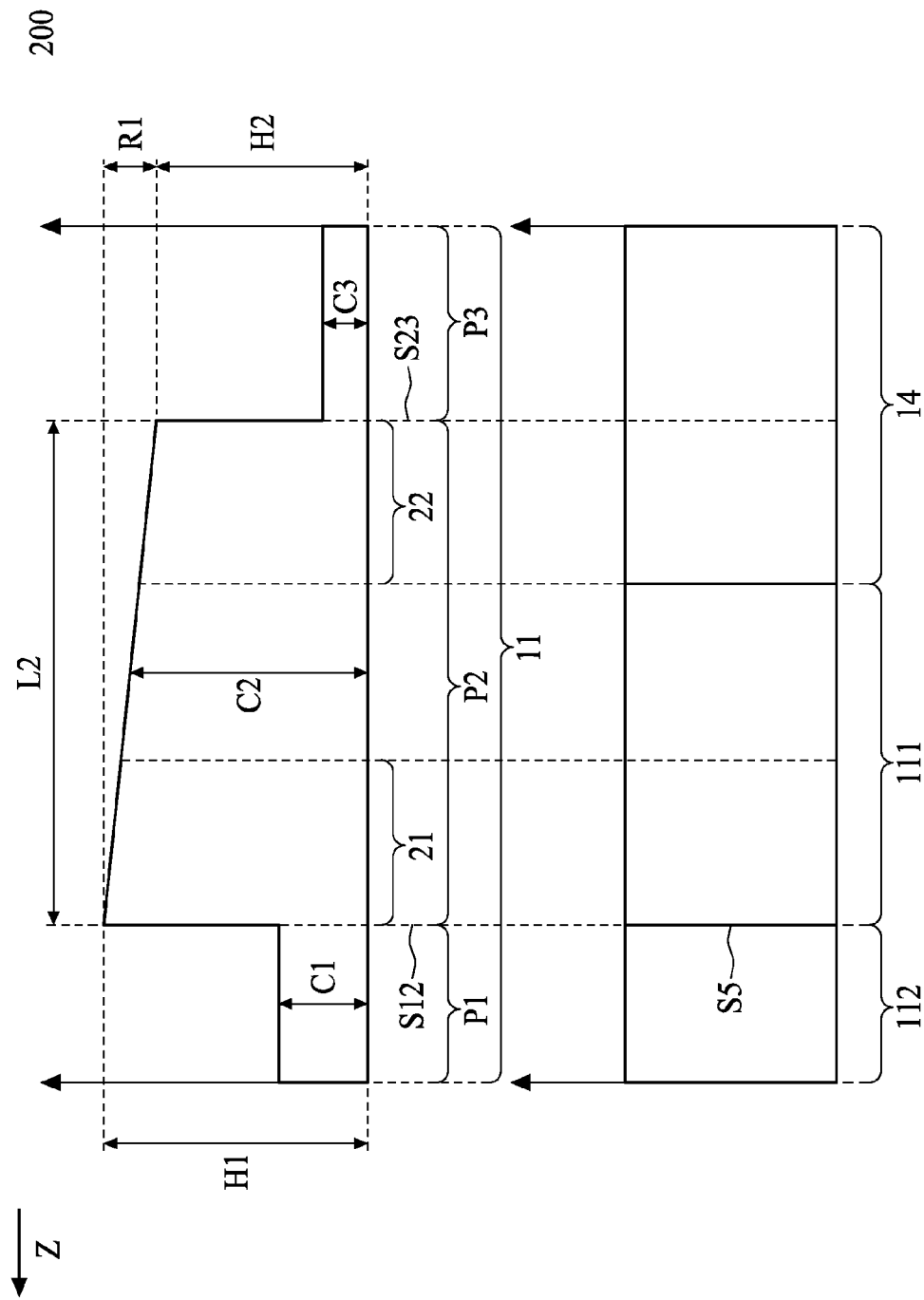

FIG. 11 illustrates the concentration profile 200 of the substance such as, SiGe or SiC in epitaxy region 11 aligned with some nearby components such as gate structure 14, channel portion 111, or fin structure 112. Concentration C1 of epitaxy region 11 is proximate to fin structure 112. Highest concentration H1 of epitaxy region 11 is proximate to boundary S5 between channel portion 111 and fin structure 112. Higher concentration C2 in portion 21 of middle portion P2 is proximate to a lower portion of channel portion 111. Lower concentration C2 in portion 22 of middle portion P2 is proximate to gate structure 14. Concentration C3 of epitaxy region 11 is proximate to gate structure 14 further away from channel portion 111.

The average of concentration C1 proximate to fin structure 112 is larger than the average of concentration C3 proximate to gate structure 14. Concentration C2 proximate to channel portion 111 is larger than concentration C2 proximate to gate structure 14.

Figure 12:
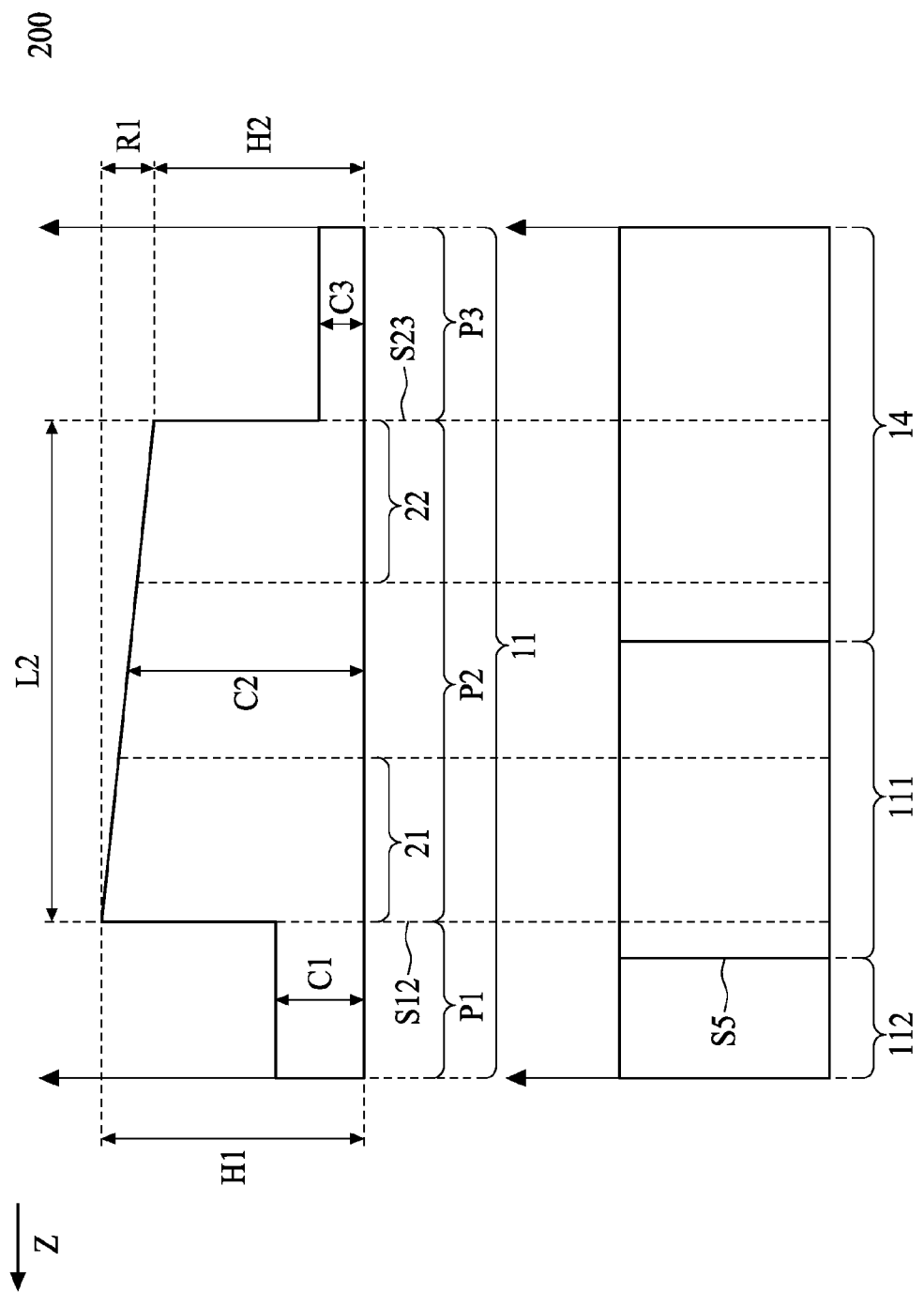

In FIG. 12, in some other embodiments, the concentration profile 200 of the substance such as, SiGe or SiC in epitaxy region 11 is aligned differently with the nearby components such as gate structure 14, channel portion 111, or fin structure 112. Channel portion 111 is offset toward direction Z. For example, interface S12 is misaligned with boundary S5 such that highest concentration H1 of is offset from boundary S5. Highest concentration H1 is proximate to a lower part of channel portion 111. Portion 22 is outside of channel portion 111. Bottom portion P1 is in contact with channel portion 111.

In some other embodiments (not shown), channel portion 111 is offset toward other direction opposite of direction Z. For example, surface S5 is covered by or in contact with portion 21 of middle portion P2. Fin structure 112 is in contact with highest concentration H1. Channel portion 111 is in contact with portion 22 of middle portion P2. In some embodiments, channel portion 111 is in contact with portion 22. Concentration of the substance such as, SiGe or SiC near channel portion 111 are larger than concentration of the substance such as, SiGe or SiC near other regions such as gate structure 14 or fin structure 112. In some embodiments, Concentration of the substance such as, SiGe or SiC near channel portion 111 are larger proximate to fin structure 112 than concentration of the substance such as, SiGe or SiC proximate to gate structure 14.

Figure 13:
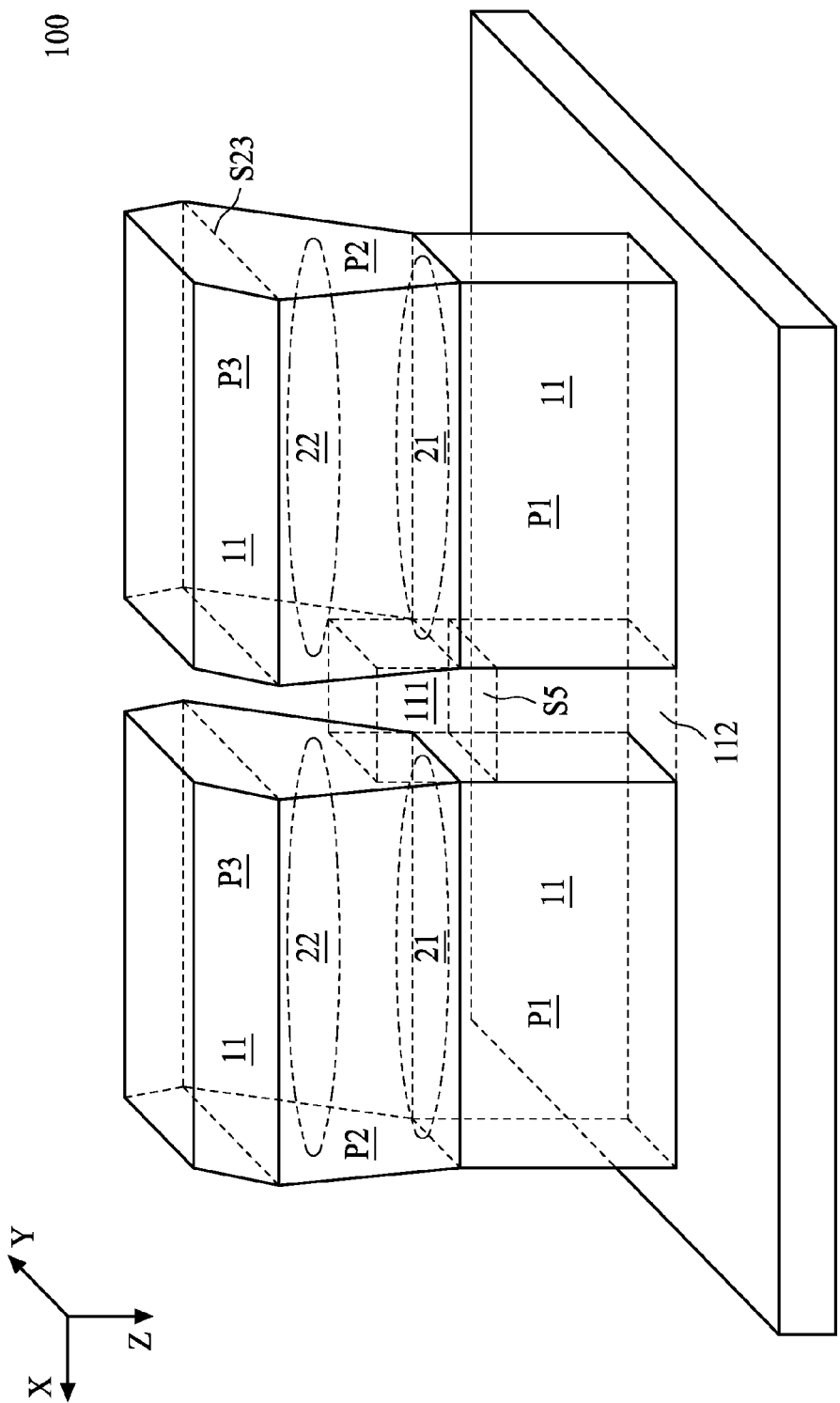

FIG. 13 illustrates boundary S5 between channel portion 111 and fin structure 112 offset below interface S12. Fin structure 112 is lower than bottom portion P1. Fin structure 112 is between epitaxy regions 11. Portion 21 of middle portion P2 is proximately in a middle of channel portion 111. Portion 22 of middle portion P2 is proximately above channel portion 111. Middle portion P2 is substantially disconnected from channel portion 111.

Figure 14:
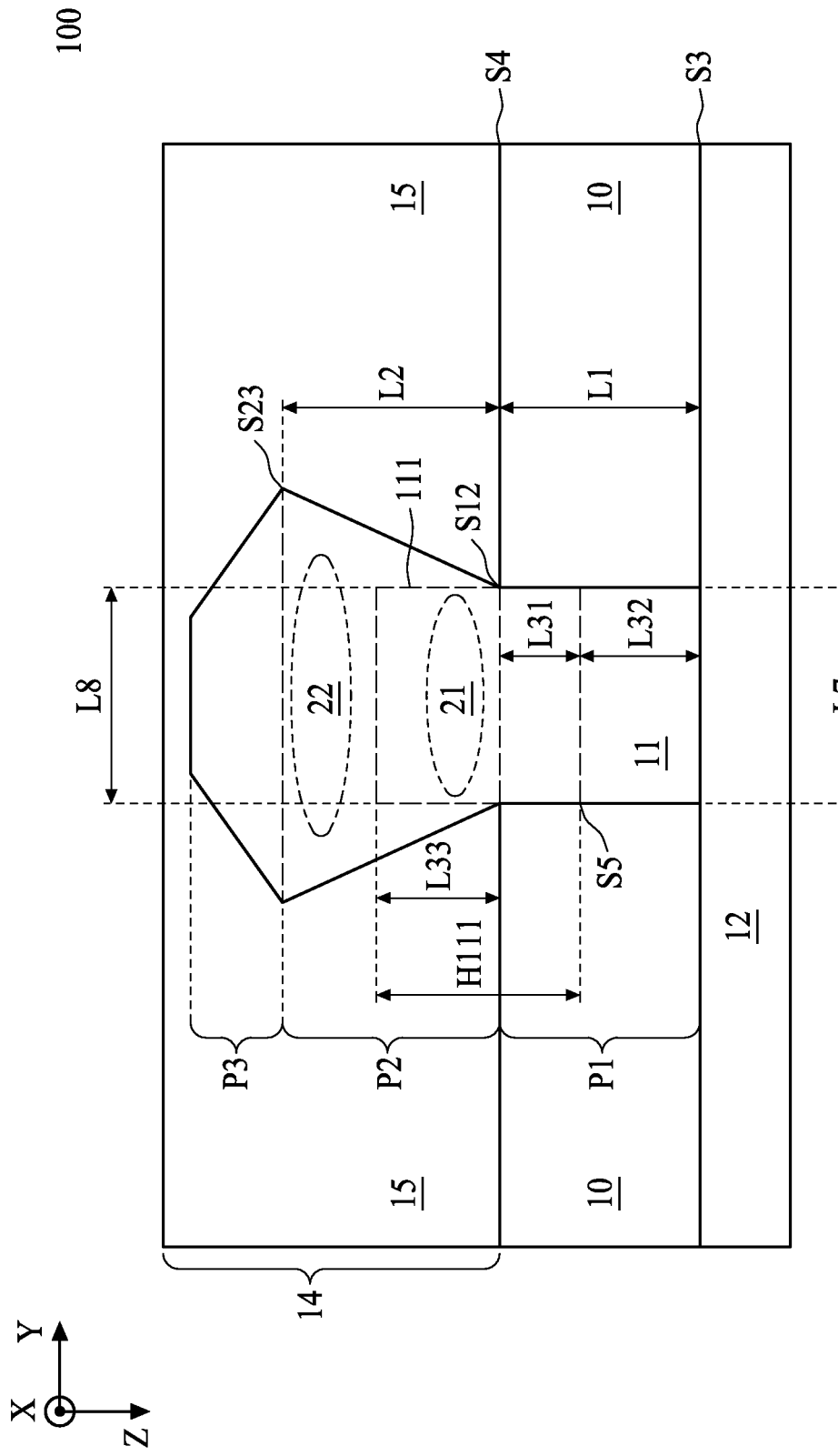

Referring to FIG. 14, boundary S5 is below surface S4 by a distance L31. Boundary S5 is above surface S3 of semiconductive substrate 12 by a distance L32. Boundary S5 is below surface S4 of isolation region 10 by a distance L31. In some embodiments, distance L31 is substantially larger than distance L32. A length of channel portion 111 is length L8. Length L8 is substantially constant in a direction orthogonal to interface S12. A length L7 is a length of epitaxy region 11. In some embodiments, length L8 is substantially equal to length L7. Height H111 is a height of channel portion 111 measured in direction Z. A ratio between height H111 and length L2 of middle portion P2 is predetermined. A ratio between distance L31 and height H111 is predetermined. A ratio between distance L32 and length L1 of bottom portion P1 is predetermined. A ratio between distance L31 and length L1 of bottom portion P1 is predetermined. A distance L33 is a difference between height H111 and distance L31. A part of channel portion 111 in contact with middle portion P2 includes distance L33. A part of channel portion 111 above surface S4 of isolation region 10 includes distance L33 measured in direction Z. A ratio between distance L33 and length L2 of middle portion P2 is predetermined.

Figure 15:
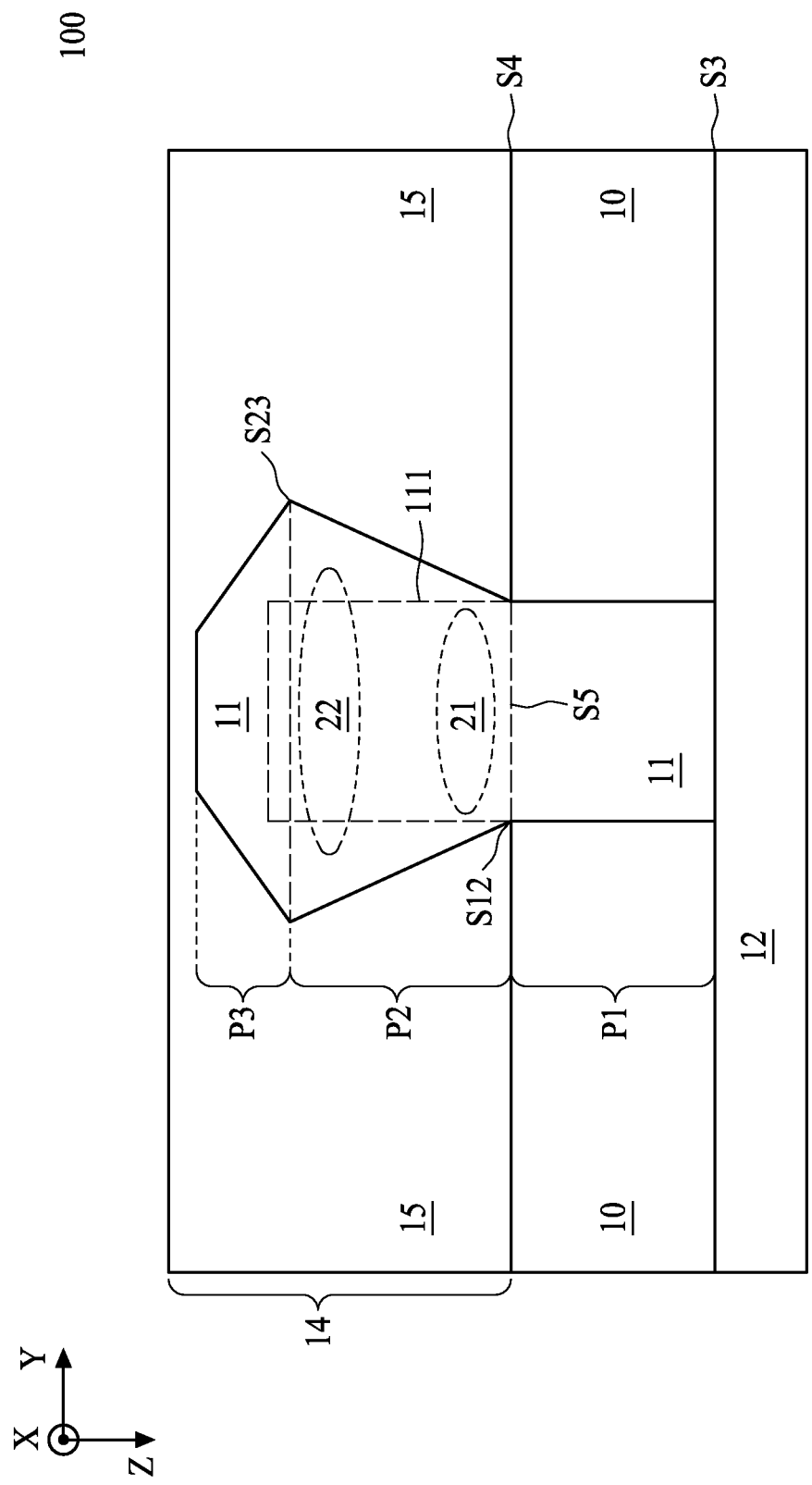

In FIG. 15, in some embodiments, channel portion 111 is in contact with a top portion P3 such that an upper portion of channel portion 111 is proximate to interface S23. In some embodiments, surface S5 of channel portion 111 is coplanar with interface S12. In some other embodiments, channel portion 111 is completely above bottom portion P1 such that surface S5 of channel portion 111 is above interface S12. In some other embodiments, channel portion 111 extends below interface S12 such that surface S5 of channel portion 111 is below interface S12.

Figure 16:
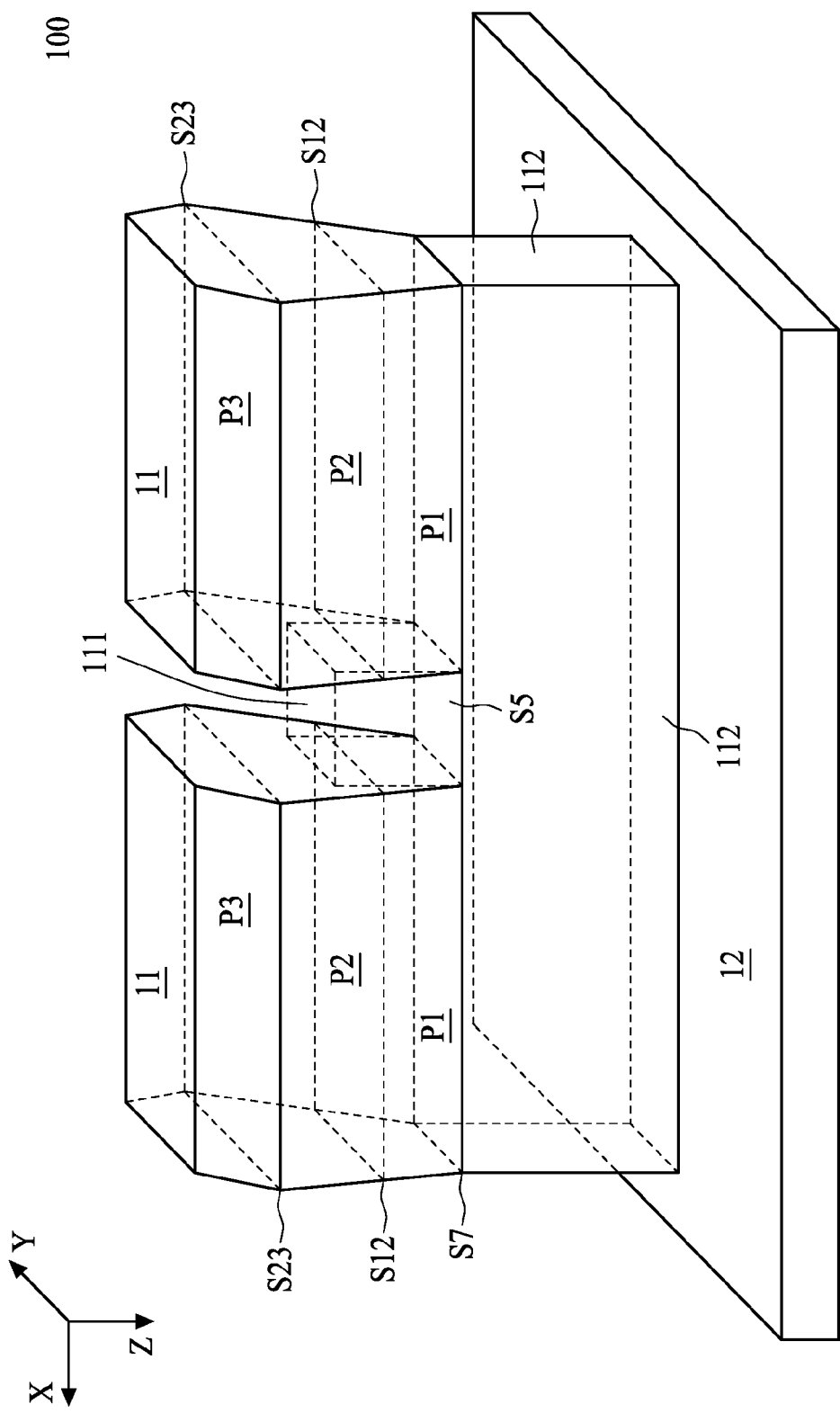

Referring to FIG. 16, epitaxy region 11 is on top of fin structure 112. In FIG. 16, in some embodiments, fin structure 112 is under epitaxy region 11. Bottom portion P1 is on top of upper surface S7 of fin structure 112. Fin structure 112 is extended above semiconductive substrate 12.

Channel portion 111 is a protruding portion of fin structure 112. Channel portion 111 is in contact with middle portion P2 or bottom portion P1 of epitaxy region 11. Boundary S5 is substantially parallel with surface S7. Boundary S5 is substantially coplanar with surface S7. In some embodiments, top portion P3, middle portion P2, and bottom portion P1 are symmetric on either side of channel portion 111. In some other embodiments, top portion P3, middle portion P2, and bottom portion P1 are antisymmetric on either side of channel portion 111. For example, interface S23 in epitaxy region 11 on one side of channel portion 111 is lower than interface S23 in epitaxy region 11 on another side of channel portion 111. Upper surface S7 of fin structure 112 on one side of channel portion 111 is lower than upper surface S7 of fin structure 112 on another side of channel portion 111.

Fin structure 112 is between epitaxy region 11 and semiconductive substrate 12. Epitaxy region 11 is in contact with fin structure 112 and channel portion 111. Fin structure 112 extends continuously in direction X. Fin structure 112 is under channel portion 111 and epitaxy region 11.

In efforts to epitaxially grow one kind of crystalline material on a surface of a different kind of material, different crystalline lattice sizes of the two materials results to a lattice mismatch proximate to boundary S5. This lattice mismatch between a starting surface such as surface S7 of fin structure 112, and subsequent layer such as epitaxy region 11, creates stress within epitaxy region 11 during the epitaxial growth.

Figure 17:
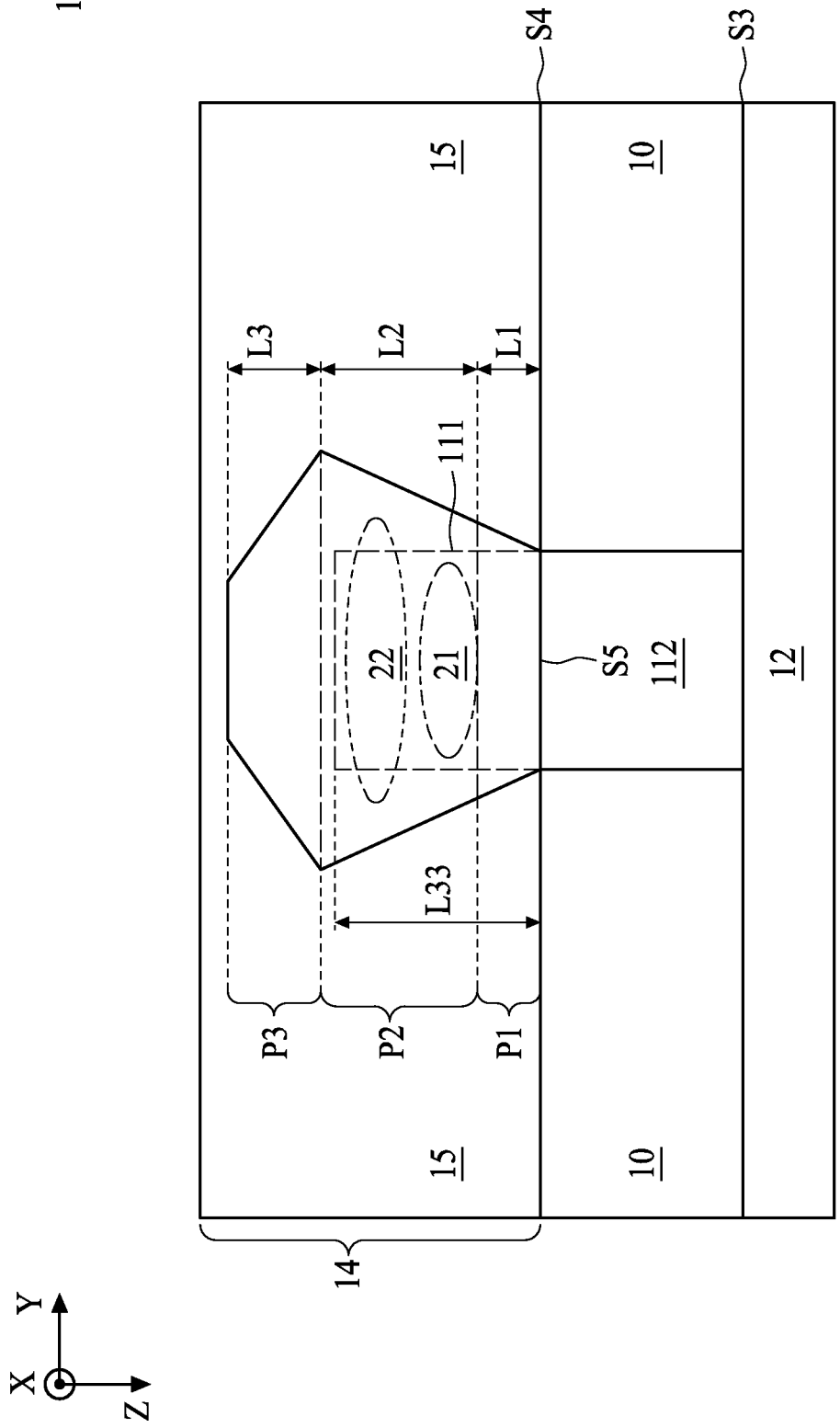

Referring to FIG. 17, bottom portion P1 is above boundary S5 and fin structure 112. Channel portion 111 is in contact with portion 21 and portion 22 of middle portion P2. Channel portion 111 is under top portion P3. In some embodiments, a predetermined ratio is between length L3 and L2. In some embodiments, a predetermined ratio is between length L1 and L2. In some embodiments, a predetermined ratio is between length L1 and L3. Distance L33 is measured parallel with direction Z from surface S4 of isolation region 10 to a top of channel portion 111. A ratio between length L1 of bottom portion P1 and distance L33 is predetermined. A ratio between distance L33 and a sum of length L1 and length L2 is predetermined.

Epitaxy region 11 is formed by one or more epitaxy or epitaxial (epi) processes, such that Si features, SiGe features, and/or other suitable features are formed in a crystalline state on fin structure 112. The epitaxy processes include CVD deposition techniques (e.g., vapor-phase epitaxy (VPE), ultra-high vacuum CVD (UHV-CVD)), molecular beam epitaxy, and/or other suitable processes. The epitaxy process uses gaseous and/or liquid precursors, which interact with a composition of fin structure 112. In some embodiments, epitaxy region 11 is in-situ doped.

The SiGe in epitaxy regions 11 creates a uni-axial compressive stress in a channel portion 111 between epitaxy regions 11 due to a lattice mismatch between the SiGe in the epitaxy regions 11 and channel portion 111 material. This compressive stress increases carrier mobility (hole mobility) and improves transistor performance.

Figure 18:
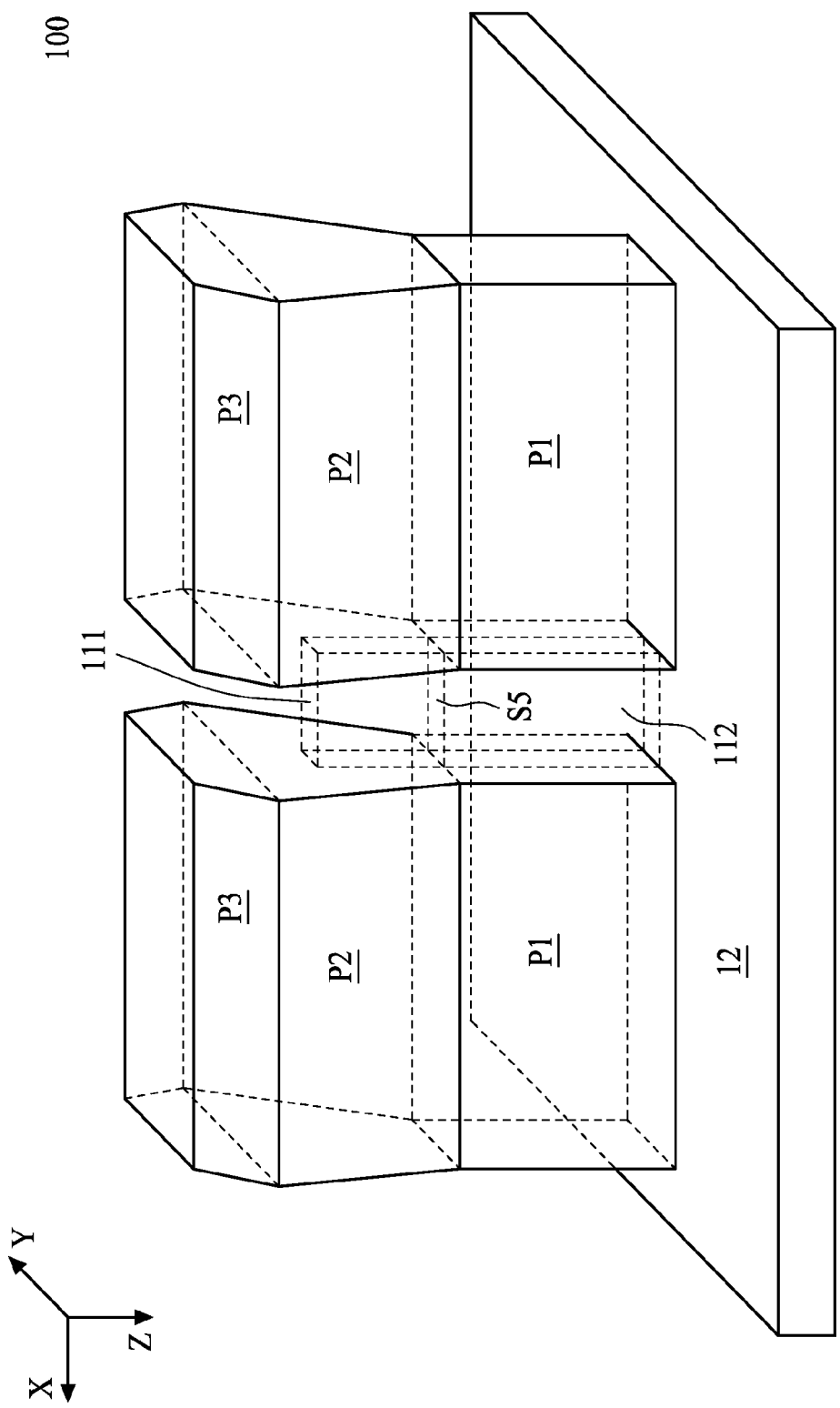

In FIG. 18, in some embodiments, channel portion 111 is thinner than bottom portion P1. Fin structure 112 is also thinner than bottom portion P1. In some other embodiments (not shown), fin structure 112 is thicker than channel portion 111.

Figure 19:
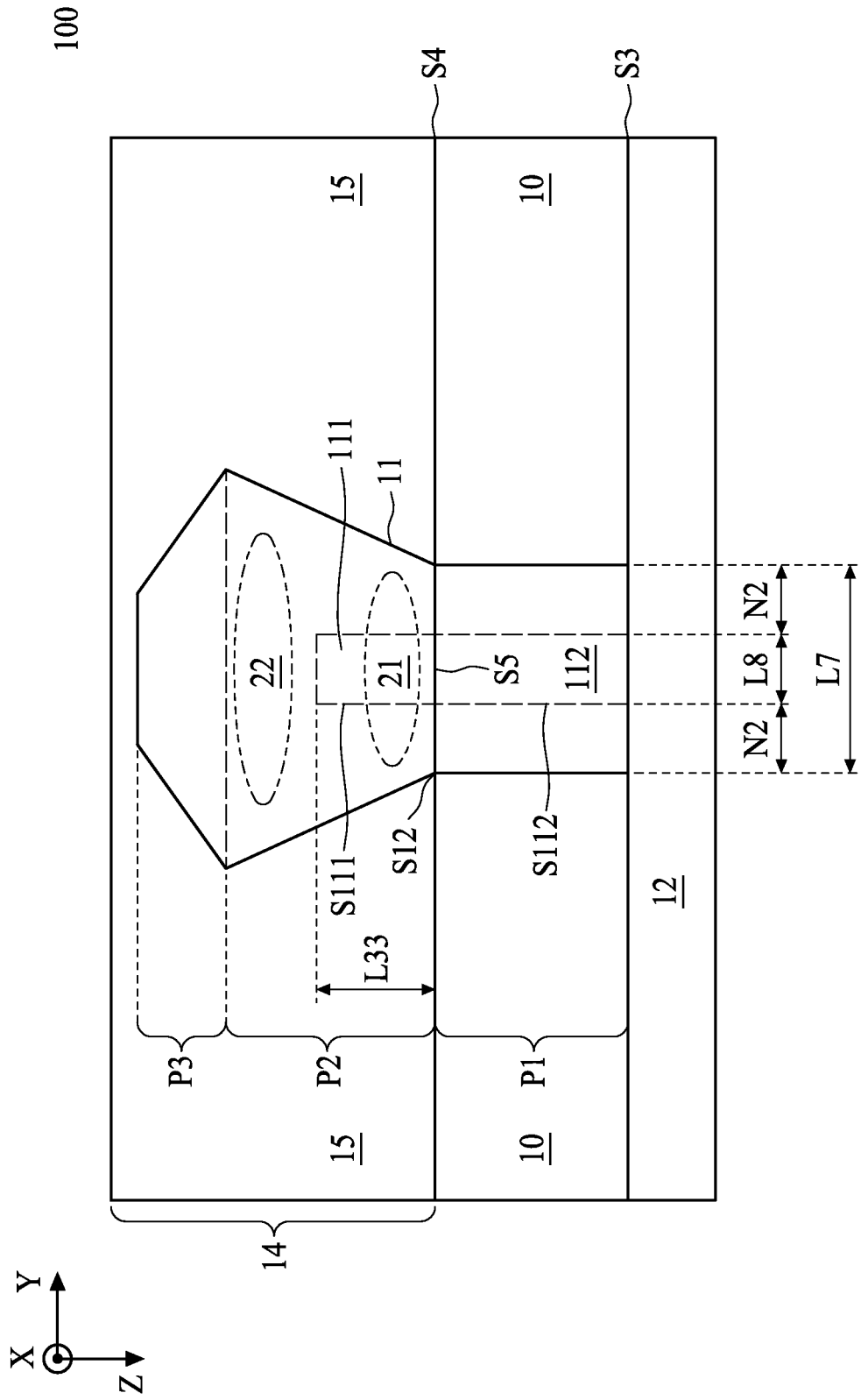

In FIG. 19, channel portion 111 includes a length L8 measured in a direction Y. Length L7 of epitaxy region 11 in bottom portion P1 is larger than length L8. Length N2 is measured from a side of epitaxy region 11 to a side of channel portion 111 in a direction parallel to direction Y. In some embodiments, channel portion 111 is aligned symmetrically at a center of epitaxy region 11 such that lengths N2 at either side of channel portion 111 are equal. A predetermined ratio is between length L8 and length L7. A ratio between distance L33 of channel portion 111 and length L8 of channel portion 111 is predetermined. A product between distance L33 and length L8 is proximately an area of a surface of channel portion 111 in contact with epitaxy region 11.

In FIG. 19, in some embodiments, lateral side S111 of channel portion 111 is substantially coplanar with lateral side 5112 of fin structure 112 such that a length of fin structure 112 is substantially equal to length L8.

In some other embodiments (not shown), fin structure 112 is thicker or thinner than channel portion 111 such that a length of fin structure 112 is larger than or smaller than length L8 of channel portion 111. Lateral side 5112 of fin structure 112 is not coplanar with lateral side S111 of channel portion 111.

Figure 20:
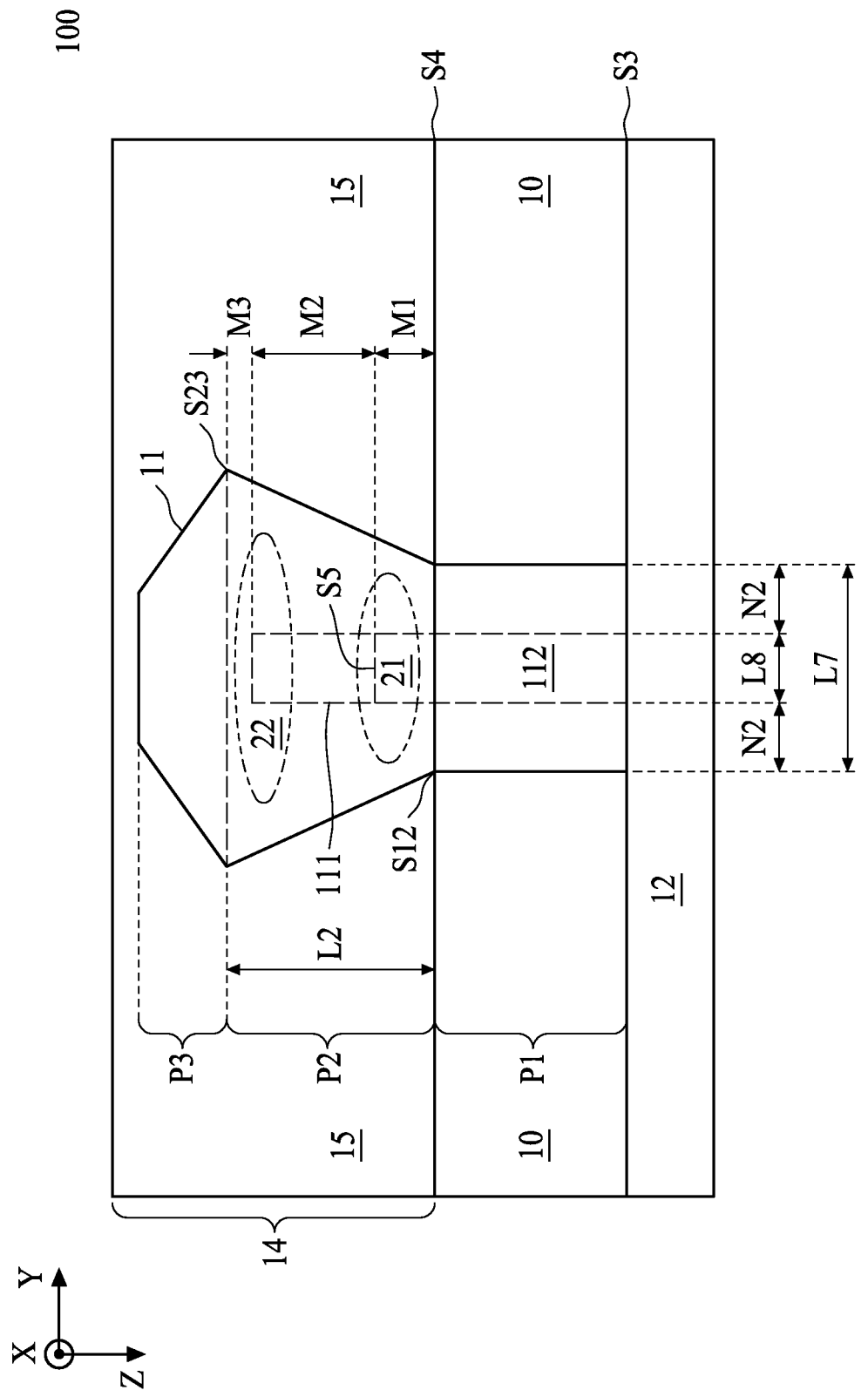

In FIG. 20, in some embodiment, channel portion 111 is completely in contact with middle portion P2 such that boundary S5 is above interface S12 by a height M1. Boundary S5 is proximate to portion 21. Channel portion 111 includes a height M2. A top side of channel portion 111 is proximate to portion 22. Interface S23 is above the top side of channel portion 111 by a height M3. A ratio between height M2 and height M1 is predetermined. A ratio between height M2 and height M3 is predetermined. A ratio between height M2 and height M1 is predetermined. In some embodiments, the ratio between height M2 and height M1 is proximately close to 1. A ratio between length L2 of middle portion P2 and height M2 is predetermined. A ratio between height M2 and a sum of height M2 and height M1 is predetermined.

A ratio between height M2 of channel portion 111 and length L8 of channel portion 111 is predetermined. A product between height M2 and length L8 is proximately an area of the surface of channel portion 111 in contact with epitaxy region 11.

Figure 21:
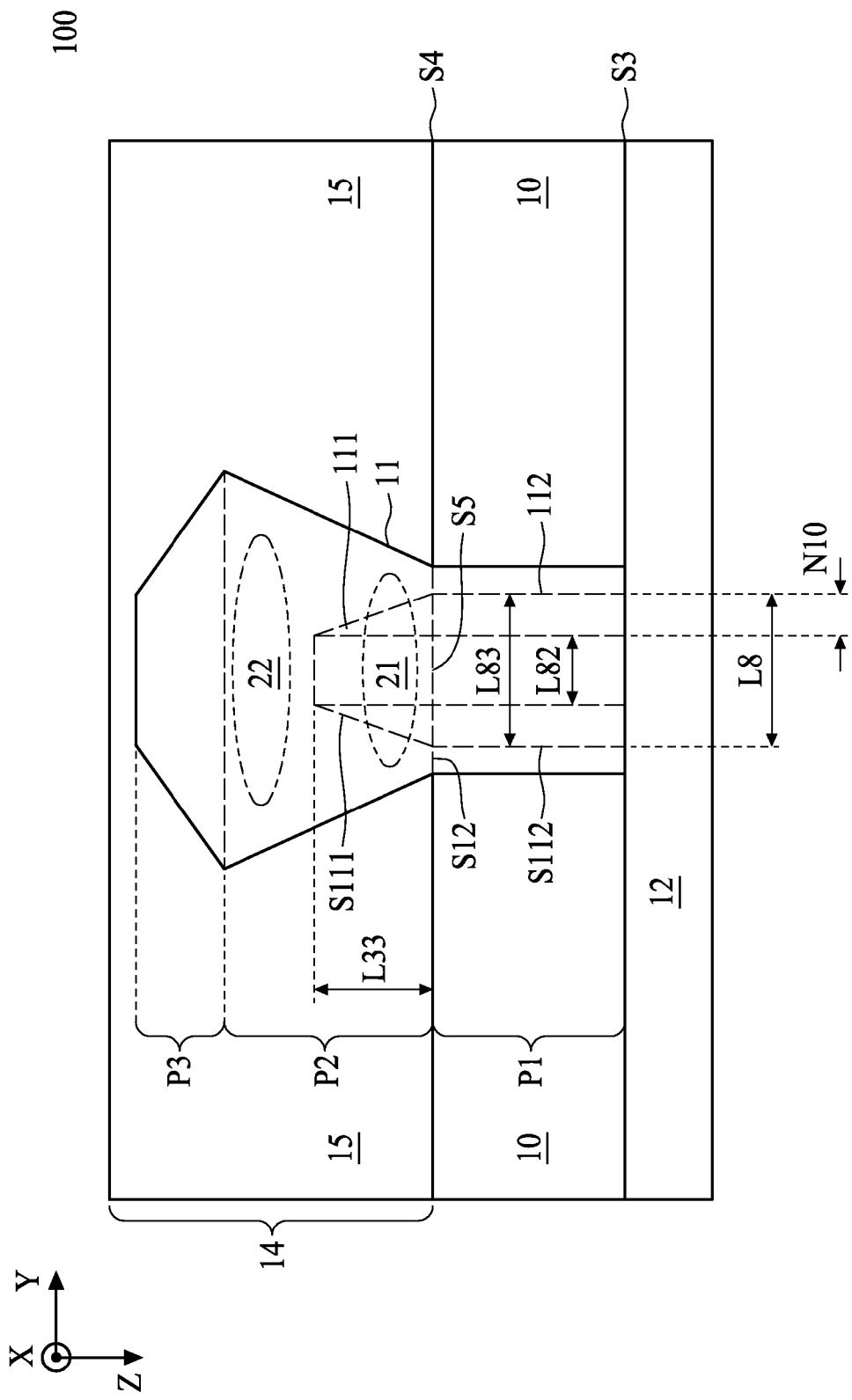

In FIG. 21, in some embodiments, the lateral side S111 of channel portion 111 is tapered. The lateral side S111 of channel portion 111 is antiparallel with the lateral side 5112 of fin structure 112. The surface of channel portion 111 in contact with epitaxy region 11 resembles a trapezoid shape. The surface is in contact with middle portion P2 of epitaxy region 11. The lateral side S111 is tilted such that length L8 of channel portion 111 includes a longest length L83 and a shortest length L82. In some embodiments, length L83 is measured in direction Y, proximately parallel with surface S5. A difference between length L83 and length L82 is length N10. A first ratio is between length L83 and L82. A second ratio is between length L83 and N10. A ratio between distance L33 of channel portion 111 and length N10 is predetermined. A ratio between distance L33 of channel portion 111 and length L83 is predetermined. A ratio between distance L33 of channel portion 111 and length L82 is predetermined. In some embodiments, decreasing the ratio between distance L33 of channel portion 111 and length L83 increases the surface of channel portion 111 in contact with portion 21.

In FIG. 22, in some embodiments, a concentration of the substance such as, SiGe or SiC in epitaxy region 11 is variable along direction X. Epitaxy region 11 includes portion 115 closer to channel portion 111 than portion 114. Portion 115 and portion 114 are symmetrical on either side of channel portion 111.

In FIG. 23, portion 115 is partially under interface S12 to be proximate to channel portion 111 partially under interface S12.

In some embodiments, S5 is antiparallel with interface S12 or surface S3. For example, surface S5 is convex upward opposite of direction Z such that a tip of surface S5 is pointing toward gate structure 14. In some other embodiments, surface S5 is convex downward in direction Z such that a tip of surface S5 is pointing toward semiconductive substrate 12.

Some embodiments of the present disclosure provide a semiconductor device. The semiconductor device includes a semiconductive substrate; a gate structure over a fin structure of the semiconductive substrate; a channel portion of the fin structure under the gate structure; and at least one epitaxy region disposed over the semiconductive substrate and in contact with the channel portion. The epitaxy region includes a substance with a first lattice constant larger than a second lattice constant of the semiconductive substrate; and a concentration profile of the substance in the epitaxy region being decreasing from near a bottom portion to near a top portion. The bottom portion is closer to the channel portion than the top portion.

Some embodiments of the present disclosure provide a semiconductor device. The semiconductor device includes a semiconductive substrate including a fin structure; a sidewall spacer of a gate structure in contact with a channel portion of the fin structure; and at least one epitaxy region disposed over the semiconductive substrate and in contact with the channel portion and the gate structure. The epitaxy region includes a bulk portion between a bottom portion and a top portion. The bottom portion being closer to the channel portion than the top portion. The epitaxy region includes a substance with a first lattice constant larger than a second lattice constant of the channel portion. A concentration profile of the substance is decreasing in the bulk portion from near the bottom portion to near the top portion.

Some embodiments of the present disclosure provide a semiconductor device. The semiconductor device includes a semiconductive substrate including a fin structure protruding above the semiconductive substrate; a channel portion of the fin structure partially inside a gate structure; at least one epitaxy region above the fin structure and partially in contact with the channel portion and the gate structure. The epitaxy region includes a second portion between a first portion and a third portion, and the first portion being closer to the semiconductive substrate than the third portion; and a substance with a first lattice constant larger than a second lattice constant of the semiconductive substrate. A concentration profile of the substance is decreasing in the second portion from near the first portion to near the third portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductive substrate;
   a gate structure over a fin structure of the semiconductive substrate;
   a channel portion of the fin structure under the gate structure;
   at least one epitaxy region disposed over the semiconductive substrate and in contact with the channel portion, and
   the epitaxy region comprising a substance with a first lattice constant larger than a second lattice constant of the semiconductive substrate, wherein the epitaxy region comprises a bottom portion and a middle portion, the bottom portion is closer to the channel portion than the middle portion, a concentration profile of the substance in the bottom portion is substantially constant, and the concentration profile of the substance in the middle portion decreases monotonically from near the bottom portion.

2. The semiconductor structure of claim 1, wherein the substance is selected from a group four element in a periodic table.

3. The semiconductor device of claim 1, wherein the epitaxy region comprises a highest concentration of the substance in the middle portion near the bottom portion.

4. The semiconductor device of claim 1, wherein the epitaxy region comprises a top portion, the middle portion is between the bottom portion and the top portion, and the concentration profile of the substance in the top portion is substantially constant.

5. The semiconductor device of Claim 4, wherein the concentration profile of the substance is higher in the bottom portion than in the top portion.

6. The semiconductor device of claim 1, wherein the concentration profile of the substance in the bottom portion is lower than a lowest concentration of the concentration profile of the substance in the middle portion.

7. A semiconductor device comprising:
   a semiconductive substrate comprising a fin structure;
   a sidewall spacer of a gate structure in contact with a channel portion of the fin structure;
   at least one epitaxy region disposed over the semiconductive substrate and in contact with the channel portion and the gate structure, and the epitaxy region comprising:
      a bulk portion between a bottom portion and a top portion, and the bottom portion being closer to the channel portion than the top portion; and
      a substance with a first lattice constant larger than a second lattice constant of the channel portion; a concentration profile of the substance in the bottom portion is substantially constant, the concentration profile of the substance in the bulk portion decreases monotonically from near the bottom portion to near the top portion, and the concentration profile of the substance in the top portion is substantially constant.

8. The semiconductor structure of claim 7, wherein the substance is selected from a group four element in a periodic table, and the epitaxy region comprising a positive dopant.

9. The semiconductor device of claim 7, wherein the bulk portion near the bottom portion is closer to the semiconductive substrate than the bulk portion near the top portion.

10. The semiconductor device of claim 7, wherein the channel portion is in contact with the bulk portion or the bottom portion of the epitaxy region.

11. The semiconductor device of claim 7, wherein the epitaxy region in between isolation regions is smaller than the epitaxy region above the isolation regions.

12. A semiconductor device comprising:
    a semiconductive substrate comprising a fin structure protruding above the semiconductive substrate;
    a channel portion of the fin structure partially inside a gate structure;
    at least one epitaxy region above the fin structure and partially in contact with the channel portion and the gate structure, and the epitaxy region comprising:
       a second portion between a first portion and a third portion, and the first portion being closer to the semiconductive substrate than the third portion; and
       a substance with a first lattice constant larger than a second lattice constant of the semiconductive substrate; a concentration profile of the substance being decreasing in the second portion from near the first portion to near the third portion, the concentration profile of the substance comprises a his hest concentration of the substance in the second portion near the first portion.

13. The semiconductor device of claim 12, wherein the first portion is closer to the channel portion than the third portion.

14. The semiconductor device of claim 12, wherein the first portion comprises a first average concentration of the substance; and the second portion comprises a second average concentration of the substance, and the first average concentration of the substance is substantially lower than the second average concentration of the substance.

15. The semiconductor device of claim 12, wherein the first portion comprises a first average concentration of the substance; and the third portion comprises a third average concentration of the substance, and the third average concentration of the substance is substantially equal to or lower than the first average concentration of the substance.

16. The semiconductor device of claim 12, wherein the first portion comprises a first average concentration of the substance; and the third portion comprises a third average concentration of the substance, and a lowest concentration of the substance in the second portion is higher than the first average concentration of the substance or the third average concentration of the substance.

* * * * *